(12) United States Patent
Lee et al.

(10) Patent No.: US 10,104,790 B2
(45) Date of Patent: Oct. 16, 2018

(54) MOBILE TERMINAL

(71) Applicant: LG ELECTRONICS INC., Seoul (KR)

(72) Inventors: Haklim Lee, Seoul (KR); Jongbeom Han, Seoul (KR); Sunglyong Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/454,278

(22) Filed: Mar. 9, 2017

(65) Prior Publication Data

US 2017/0374749 A1 Dec. 28, 2017

(30) Foreign Application Priority Data

Jun. 28, 2016 (KR) .......................... 10-2016-0080732

(51) Int. Cl.
| | |
|---|---|
| *H05K 5/00* | (2006.01) |
| *H05K 5/02* | (2006.01) |
| *E05D 11/00* | (2006.01) |

(52) U.S. Cl.
CPC ....... *H05K 5/0017* (2013.01); *E05D 11/0054* (2013.01); *H05K 5/0086* (2013.01); *H05K 5/0226* (2013.01); *E05Y 2900/606* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,379,378 | B2* | 2/2013 | Visser ................... | G06F 1/1616 16/221 |
| 9,250,733 | B2* | 2/2016 | Lee ......................... | H04M 1/02 |
| 9,348,450 | B1* | 5/2016 | Kim ...................... | G06F 1/1681 |
| 9,557,771 | B2* | 1/2017 | Park ...................... | G06F 1/1641 |
| 2008/0300031 | A1 | 12/2008 | Cho et al. | |
| 2010/0246103 | A1* | 9/2010 | Visser ................... | G06F 1/1616 361/679.01 |
| 2012/0262870 | A1 | 10/2012 | Leung | |

(Continued)

FOREIGN PATENT DOCUMENTS

| | | |
|---|---|---|
| KR | 10-2011-0028893 A | 3/2011 |
| KR | 20-2012-0007344 U | 10/2012 |
| KR | 10-2016-0032080 A | 3/2016 |

*Primary Examiner* — Lisa Lea Edmonds

(74) *Attorney, Agent, or Firm* — Birch, Stewart, Kolasch & Birch, LLP

(57) ABSTRACT

A mobile terminal is disclosed. The mobile terminal comprises a flexible display; a first body positioned at a rear of the flexible display, the first body connected to the flexible display; a second body positioned at the rear of the flexible display, the second body connected to the flexible display and spaced apart from the first body, the second body movable with respect to the first body; a hinge assembly positioned at the rear of the flexible display, the hinge assembly located between the first body and the second body, the hinge assembly connecting the first body and the second body; and a hinge cover positioned at a lateral side of the hinge assembly, the hinge cover between the first body and the second body, wherein the hinge cover has a thinner thickness toward a central portion of the hinge cover from both ends of the hinge cover in a direction from the hinge cover toward the hinge assembly.

12 Claims, 31 Drawing Sheets

(56) References Cited

U.S. PATENT DOCUMENTS

| | | | |
|---|---|---|---|
| 2012/0307423 A1 | 12/2012 | Bohn et al. | |
| 2013/0037228 A1* | 2/2013 | Verschoor | G06F 1/1652 160/377 |
| 2015/0185782 A1 | 7/2015 | Kim et al. | |
| 2015/0241925 A1* | 8/2015 | Seo | G06F 1/1681 361/679.27 |
| 2015/0366089 A1* | 12/2015 | Park | G06F 1/1641 361/679.01 |
| 2015/0378397 A1* | 12/2015 | Park | G06F 1/1652 361/679.27 |
| 2016/0187935 A1* | 6/2016 | Tazbaz | G06F 1/1681 361/679.03 |

* cited by examiner (a)

(b)

(a)

(b)

(a)

(b)

(a)

(b)

(a)

(b)

(a)

(b)

(a)

(b)

(a)

(b)

(a)

(b)

MOBILE TERMINAL

This application claims the benefit of Korean Patent Application No. 10-2016-0080732 filed on Jun. 28, 2016, the entire contents of which are incorporated herein by reference for all purposes as if fully set forth herein.

BACKGROUND OF THE INVENTION

Field of the Invention

The present invention relates to a mobile terminal, and more particularly to a mobile terminal capable of hiding a hinge assembly folding a display in a folding area to realize a seamless sense of unity.

Discussion of the Related Art

A terminal can be divided into a mobile/portable terminal and a stationary terminal depending on whether the terminal is movable. Again, the mobile terminal can be divided into a handheld terminal and a vehicle mounted terminal according to whether the user can carry the mobile phone directly.

The functions of mobile terminals have been diversified. For example, there are data and voice communication, photographing and video shooting through a camera, voice recording, music file playback through a speaker system, and output of images or video on a display. Some terminals are equipped with an electronic game play function or a multimedia player function. In particular, modern mobile terminals can receive multicast signals that provide visual content such as broadcast and video or television programs.

Such a terminal, for example, may be realized as a multimedia player (multimedia player) having a complex function such as photographing or video shooting, playback of music or video file.

For supporting and increasing the functionality of such terminals, it is contemplated to improve the structural and/or software aspects of the terminal.

Meanwhile, a mobile terminal can fold a display using a hinge assembly disposed on a body. In the mobile terminal in which the display is folded, a part of the hinge assembly is exposed to the outside in the banding region of the body. Part of the hinge assembly is exposed to the outside, so that foreign matter or moisture can be penetrated into the inside of the mobile terminal. The hinge assembly exposed to the outside has a problem that a malfunction occurs due to foreign matter or moisture.

SUMMARY OF THE INVENTION

An object of the present disclosure is to address the above-described and other problems.

Another object of the present disclosure is to provide a mobile terminal of which hinge assembly is not exposed.

Another object of the present disclosure is to provide a mobile terminal realizing a seamless sense of unity.

In one aspect, there is provided a mobile terminal comprising: a flexible display; a first body positioned at a rear of the flexible display, the first body connected to the flexible display; a second body positioned at the rear of the flexible display, the second body connected to the flexible display and spaced apart from the first body, the second body movable with respect to the first body; a hinge assembly positioned at the rear of the flexible display, the hinge assembly located between the first body and the second body, the hinge assembly connecting the first body and the second body; and a hinge cover positioned at a lateral side of the hinge assembly, the hinge cover between the first body and the second body, wherein the hinge cover has a thinner thickness toward a central portion of the hinge cover from both ends of the hinge cover, the thinner thickness in a direction from the flexible display toward the hinge assembly.

The hinge cover may include a first layer facing a rear of the mobile terminal and a second surface opposite the first surface. The second surface may be exposed to an outside of the mobile terminal.

The first surface may be convex in a direction from the first surface toward the second surface.

The first surface may include a groove.

A length of the first surface may be greater than a length of the second surface in a direction between both ends of the hinge cover.

In another aspect, there is provided a mobile terminal comprising: a flexible display; a first body positioned at a rear of the flexible display, the first body connected to the flexible display; a second body positioned at the rear of the flexible display, the second body connected to the flexible display and spaced apart from the first body, the second body movable with respect to the first body; a hinge assembly positioned at the rear of the flexible display, the hinge assembly located between the first body and the second body, the hinge assembly connecting the first body and the second body; and a hinge cover positioned at a lateral side of the hinge assembly, the hinge cover between the first body and the second body, wherein the hinge cover includes a plurality of layers, wherein a layer among the plurality of layers has a modulus different from a modules of an another layer among the plurality of layers.

The hinge cover may include a first layer facing a rear of the mobile terminal and a second layer positioned on a front surface of the first layer. The second layer may have a modulus greater than a modulus of the first layer.

The hinge cover may form an neutral plane. A side of the hinge cover may be provided with a compressive stress. An another side of the hinge cover may be provided with a tensile stress. The neutral plane may be positioned between the side of the hinge cover and the another side of the hinge cover.

The neutral plane may coincide a boundary between the first layer and the second layer.

The neutral plane of the hinge cover is located at the flexible display.

The hinge cover may include a third layer positioned between the first layer and the second layer. The neutral plane is may located in the third layer.

The third layer may have a hardness greater than a hardness of the first layer and the second layer.

According to at least one aspect of the present disclosure, the present disclosure may make the hinge assembly of the mobile terminal not exposed.

According to at least one aspect of the present disclosure, seamless sense of unity may be realized.

According to at least one aspect of the present disclosure, misbehavior of the mobile terminal because of foreign matter or moisture passing through the hinge assembly may be prevented Additional features and advantages of the invention will be set forth in the description which follows, and in part will be apparent from the description, or may be learned by practice of the invention. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
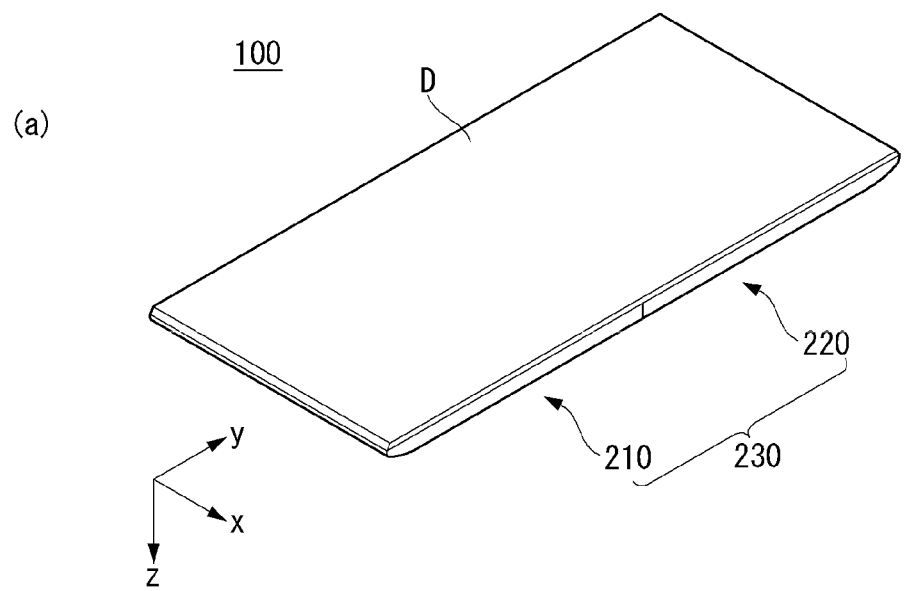
FIGS. 1 to 3 are views illustrating a mobile terminal according to an embodiment of the present invention.
Figure 1:
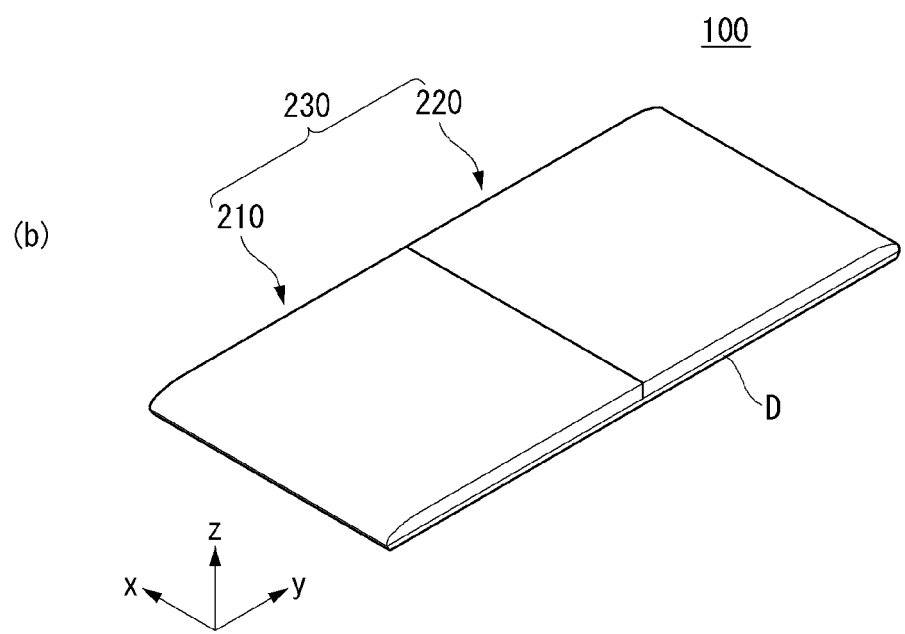

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

The electronic device described in this specification may be a mobile phone, a smart phone, a laptop computer, a digital broadcasting terminal, a personal digital assistant (PDA), a portable multimedia player (PMP) A slate PC, a tablet PC, an ultrabook, a wearable device such as a smart watch, a smart glass, and a head mounted display (HMD).

However, it will be apparent to those skilled in the art that the configuration according to the embodiments described herein may be applied to fixed terminals such as a digital TV, a desktop computer, a digital signage, and the like, You will know.

Figure 2:
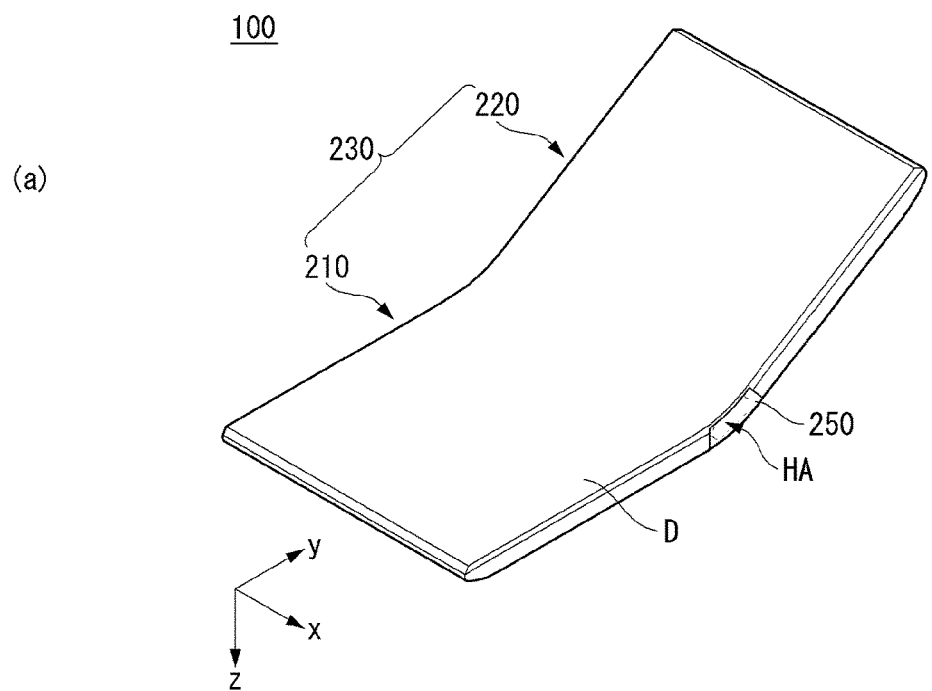
Figure 2:
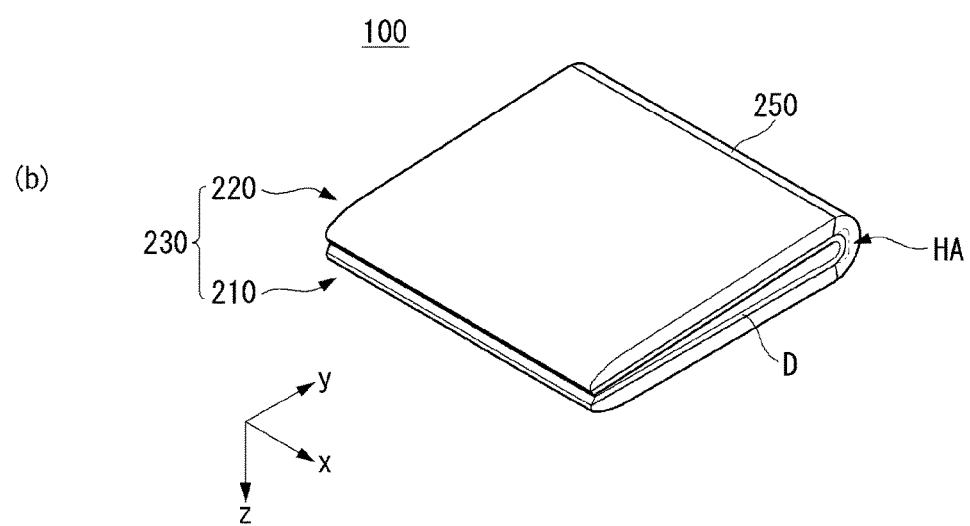
Figure 3:
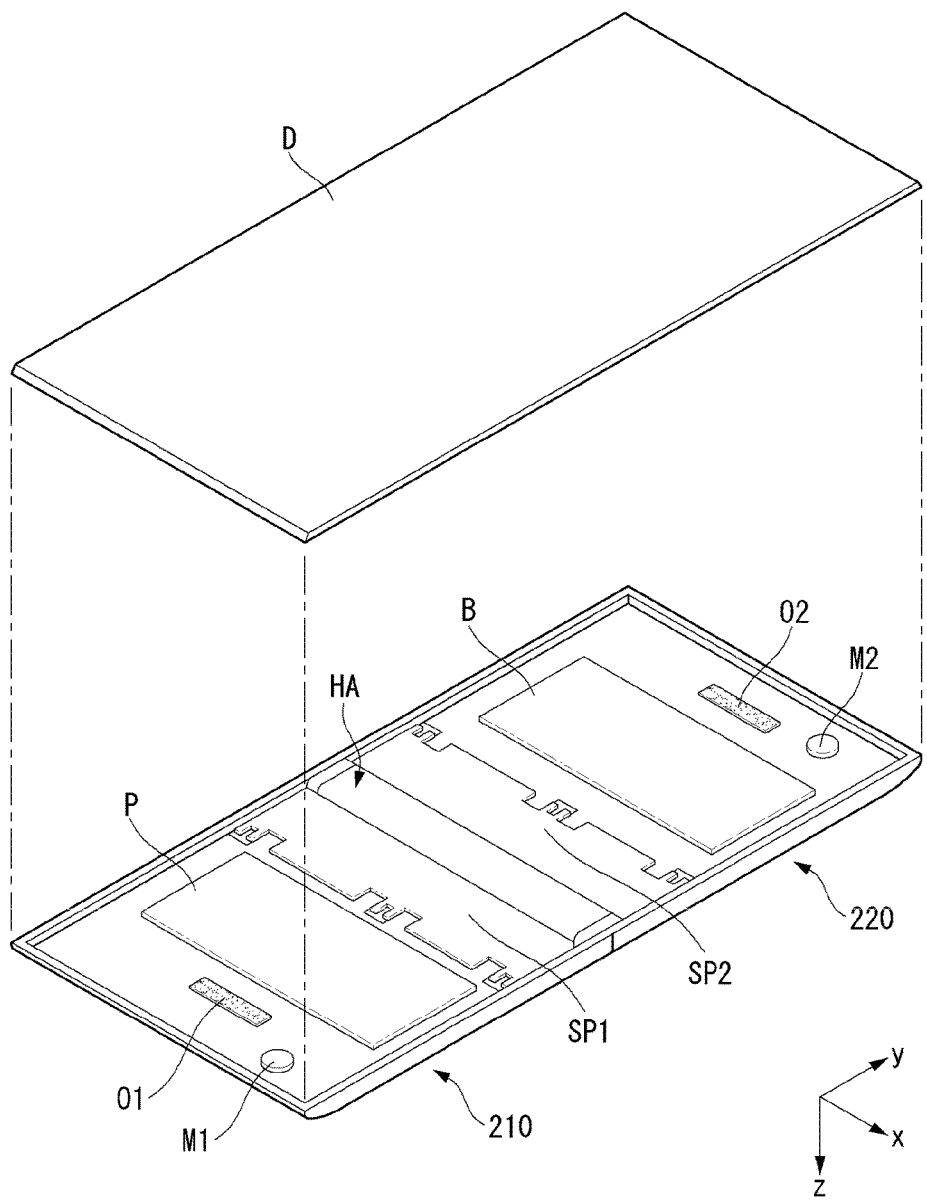

Referring to FIGS. 1 to 3, a body 230 of a mobile terminal 100 may be foldable. An end and an another end of the body 230 may be folded in the form of being in close proximity and/or in contact with each other. The body 230 may be provided with a display D on at least one side thereof.

The display D may be formed substantially on the front surface of the body 230. This may be different from the conventional folder phone. The mobile terminal 100 according to the embodiment of the present invention may include a display D from an end of the body 230 to an opposite end of the body 230.

The display D may be flexible. When the body 230 is folded or bent, the display D can also be folded or bent accordingly. The flexible display D may be located in substantially the front surface of the body 230.

The mobile terminal 100 may have a certain thickness. The thickness of the mobile terminal may be in the Z direction. The thickness of the mobile terminal 100 may be sum of the thickness of components including the body 230 and display D.

The mobile terminal 100 may be in a state among states including a first state or a second state.

The first state may be a state in which the body 230 is flat or unfolded. For example, if the body 230 is divided into a plurality of bodies 210 and 220, the first state may be a state in which bodies 210 and 220 are disposed on the same plane. In the first state S1, the mobile terminal 100 may be viewed as a stick or plate.

The second state S2 may be a state in which the body 230 is bent or folded. For example, if the body 230 is divided into first body 210 and second body 220, the second state may be a state in which the first body 210 is folded to the second body 220. In the second state S2, the total length of the mobile terminal 100 can be seen in about half.

The mobile terminal 100 according to an embodiment of the present invention may be in any one of the first state and the second state and/or the middle state of the first and second states.

Referring to FIG. 1, a front view and a rear view of the mobile terminal 100 according to an embodiment of the present invention are shown. FIG. 1 (a) shows a front view of the mobile terminal 100, and FIG. 1 (b) shows a rear view of the mobile terminal 100.

The body 230 of the mobile terminal 100 may include a first body 210 and a second body 220. The display D may be located on the first and second bodies 210 and 220. The first body 210 and the second body 220 may positioned behind the display D.

FIG. 2 (a) illustrates a situation in which the mobile terminal 100 according to an embodiment of the present invention is in an intermediate state between the first state and the second state. As shown in FIG. 2 (a), the first and second bodies 210 and 220 of the mobile terminal 100 may be in a third state bent at a certain angle. The change from the first state to the second state and/or the fixation to the third state may be via the hinge assembly HA connecting the first and second bodies 210 and 220. The movement of the first body 210 and the second body 220 may be referred to as a pivot movement with respect to the hinge assembly HA. The hinge assembly HA may provide pivotal movement to the first body 210 and the second body 220.

FIG. 2 (b) illustrates a situation in which the mobile terminal 100 is in the second state according to an embodiment of the present invention. As shown in FIG. 2 (b), the mobile terminal 100 may be in a second state in which the first and second bodies 210 and 220 face each other. The display D may be located between the first body 210 and the second body 220.

A hinge cover 250 may be disposed between the first and second bodies 210 and 220 to prevent the hinge assembly HA from being exposed to the outside. A detailed description thereof will be described later.

FIG. 3 shows the hinge assembly HA included in the mobile terminal 100 according to an embodiment of the present invention. As shown, the hinge assembly HA may be positioned between the first body 210 and the second body 220.

The substrate P may be positioned inside the mobile terminal 100. The substrate P may be positioned on any one of the first and second bodies 210 and 220. For example, the substrate P may be located on the first body 210.

The battery B may be located inside the mobile terminal 100. The battery B may be located in any one of the first and second bodies 210 and 220. For example, the battery B may be located in the second body 220.

The plurality of sound output units O1 and O2 may be located inside the mobile terminal 100. The plurality of microphones M1 and M2 may be located inside the mobile terminal 100. For example, the plurality of sound output units O1 and O2 may be positioned at one end and the other end of the body 210 and 220, respectively. The plurality of microphones M1 and M2 may be positioned at one end and the other end of the bodies 210 and 220, respectively.

The hinge assembly HA may be positioned between the first body 210 and the second body 220. The hinge assembly HA may be positioned between the first body 210 and the second body 220 in the first state. The hinge assembly HA may connect the first body 210 and the second body 220 to each other. The hinge assembly HA may provide pivot motion to the first body 210 and the second body 220.

The hinge assembly HA can be connected to the support plate SP. The support plate SP may include a first support plate SP1 and a second support plate SP2. The first support plate SP1 may be disposed on the first body 210 and the second support plate SP2 may be disposed on the second body 220. The first support plate SP1 can connect the first body 210 and the hinge assembly HA. The second support plate SP2 can connect the second body 220 and the hinge assembly HA.

The banding area BA (see FIG. 4) may include an area where the hinge assembly HA and the support plate SP are disposed. The banding region BA (see FIG. 4) may refer to a region where the bodies 210 and 220 are bent or folded. The display D can be bent or folded in the banding area BA (see FIG. 4).

Figure 4:
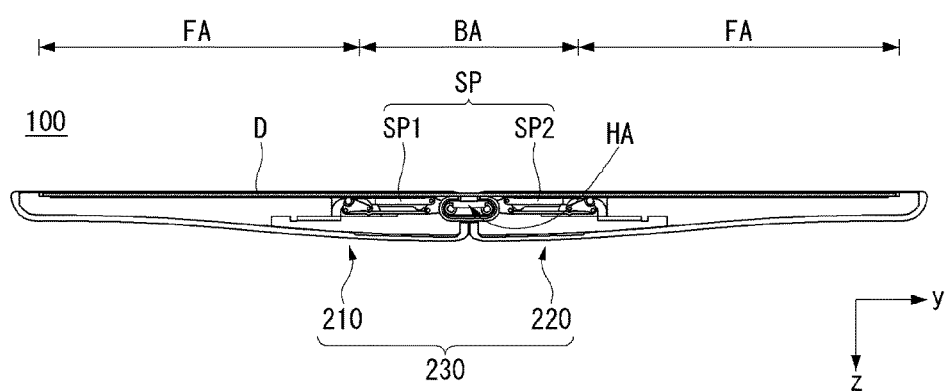
FIGS. 4 and 5 are views showing a change of a display according to an operation of the mobile terminal according to the present invention.
Figure 4:
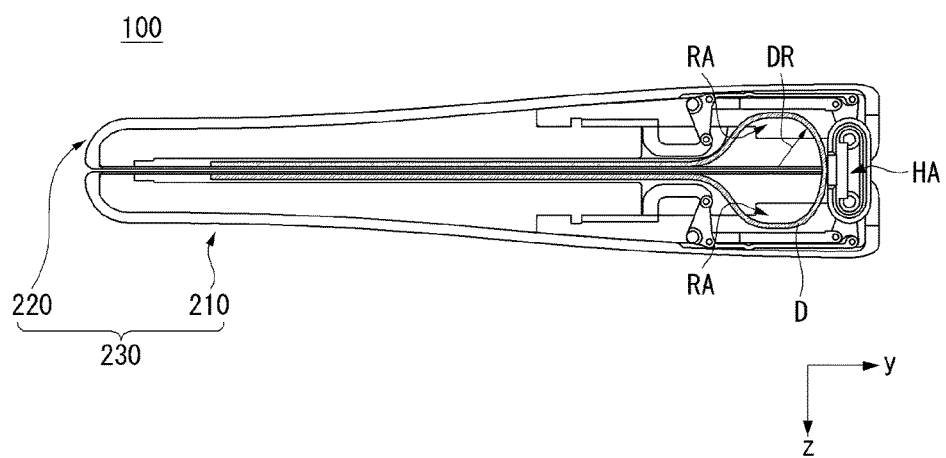

Referring to FIG. 4 (a), the center portion of the display D may be positioned on the hinge assembly HA. Both sides of the display D may be located on the first and second bodies 210 and 220. The central portion of the display D may be located between the two sides of the display D.

The display D can maintain a flat shape in the first state. The display D may not be bent in the first state. The upper surface of the support plate SP, the upper surface of the hinge assembly HA, and the upper surface of the bodies 210, 220 may form substantially the same plane. In this case, the user can focus more on the flat display D screen.

Referring to FIG. 4 (*b*), at least a portion of the display D may be located in the recessed area RA in the second state. At least a portion of the display (D) may include a central portion of the display (D). The recessed area RA may be formed as the support plate SP moves inside the body 230. At least a portion of the display D may have a certain range of radius DR in the recessed area RA. The recessed area RA may mean a space formed by the support plate SP and the hinge assembly HA in the second state.

When the mobile terminal 100 transits from the first state to the second state, the support plate SP can move toward the rear surface of the body 230. The rear surface of the body 230 may be located on the opposite side of the front surface of the body 230. The display D may be located on the front side of the body 230 in the first state. When the body 230 transits from the first state to the second state, the support plate SP can slide in the direction of retreating from the front surface of the body 230.

The hinge assembly HA may be attached to the display D. For example, the center of the hinge assembly HA may be attached to the display D.

Since the center portion of the hinge assembly HA is attached to the display D, the display D can be located in the recessed area RA with a certain radius DR in the second state. The hinge assembly HA can guide the shape in which the display D is bent.

In the second state, the display D may be flat in an area except the recessed area RA. In an area other than the recessed area RA, the display D may be attached to the body 230.

The portion of the display D located in the recessed area RA can be referred to as a banding area BA. The portion of the display D positioned outside the recessed area RA can be referred to as a flat area FA.

Figure 5:
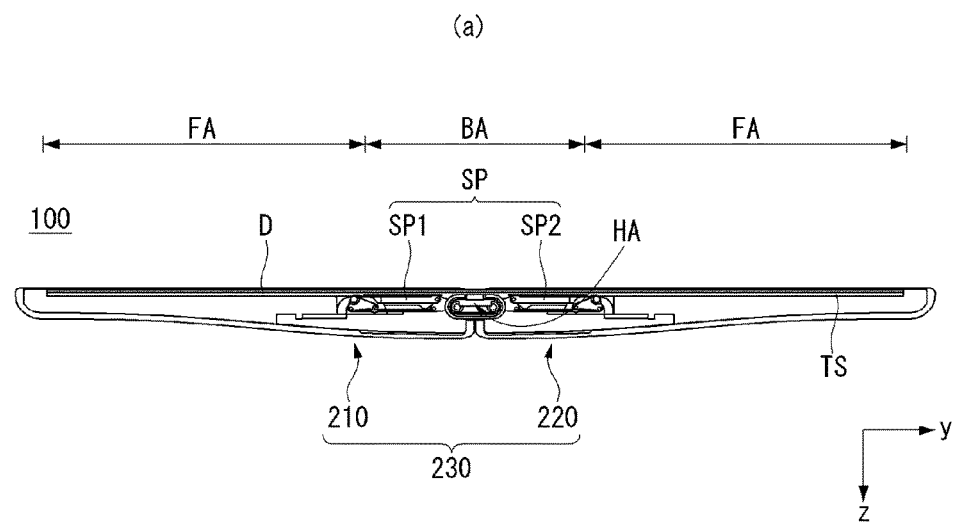
Figure 5:
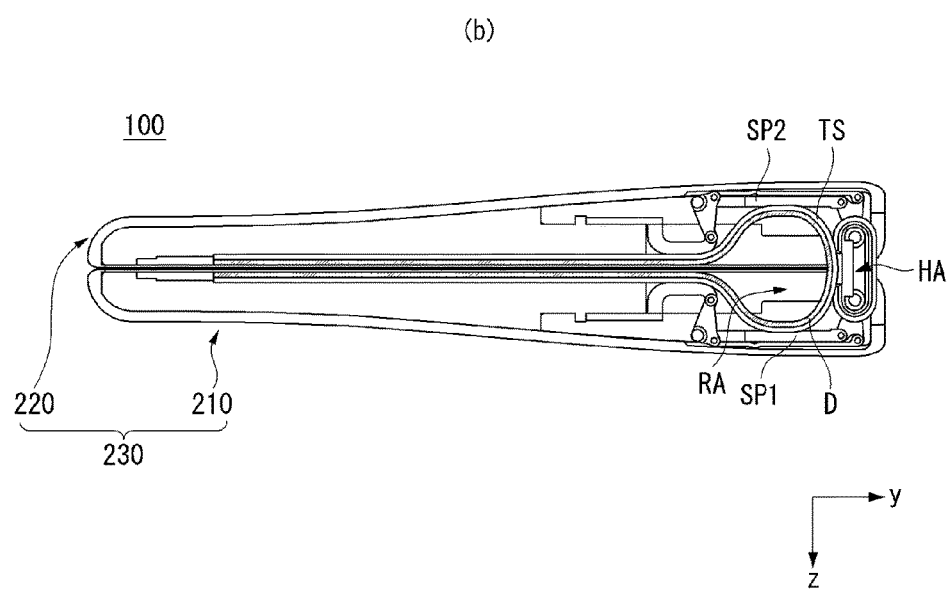

Referring to FIG. 5 (*a*), an elastic layer TS may be positioned on at least one surface of the display D.

The elastic layer TS may be positioned between the display D and the body 230. The elastic layer TS may not be exposed to the outside by the display D. The elastic layer TS may include a material having high elasticity. The elastic layer TS can prevent physical deformation of the display D. The elastic layer TS can cancel the tensile stress formed outside the display D using the restoring force. The elastic layer TS may comprise silicon.

The elastic layer TS can guide the display D. The elastic layer TS may guide the display D so that the display D remains flat in the first state. The elastic layer TS can guide the display D to reduce the stress exerted on the display D in the second state.

Referring to FIG. 5 (*b*), the elastic layer TS may be attached to the display D. The elastic layer TS may be recessed into the body 230 in the second state. The elastic layer TS can be repeatedly stretched and shrunk. The elastic layer TS can be strongly adhered to the display D.

The elastic layer TS can prevent wrinkling and/or breakage of the display (D). The elastic layer TS can prevent cracking of the display D.

The elastic layer TS may be attached to a surface of the display D. In the second or third state, the display D can be moved more flexibly by the elastic layer TS and can maintain flatness.

Figure 6:
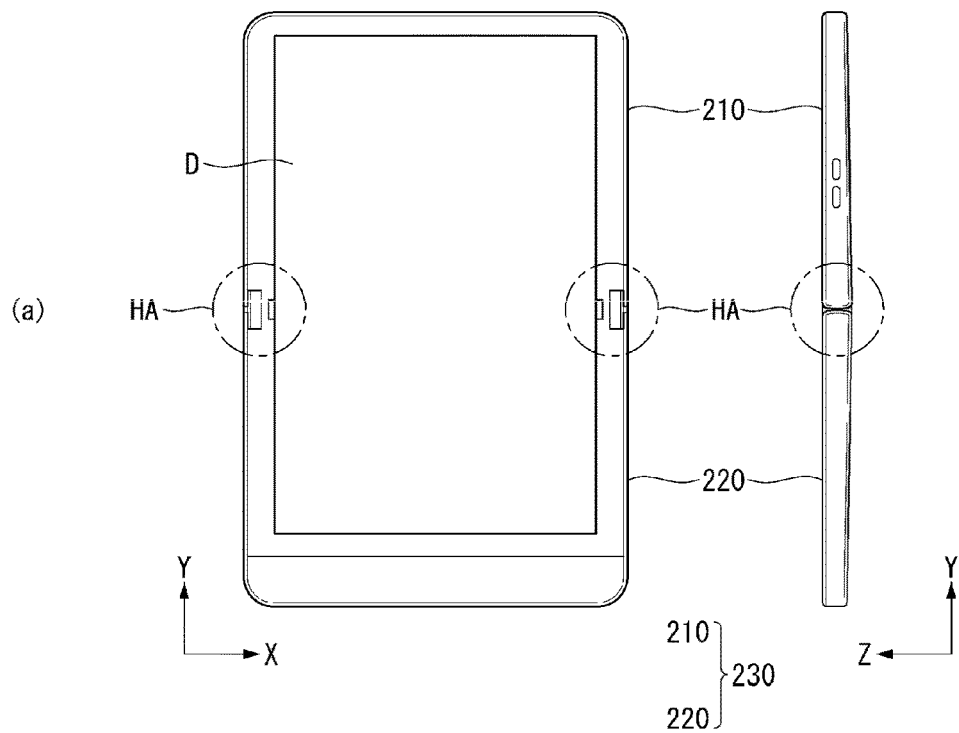
FIG. 6 is a view illustrating a hinge assembly exposed in a mobile terminal according to an embodiment of the present invention.
Figure 6:
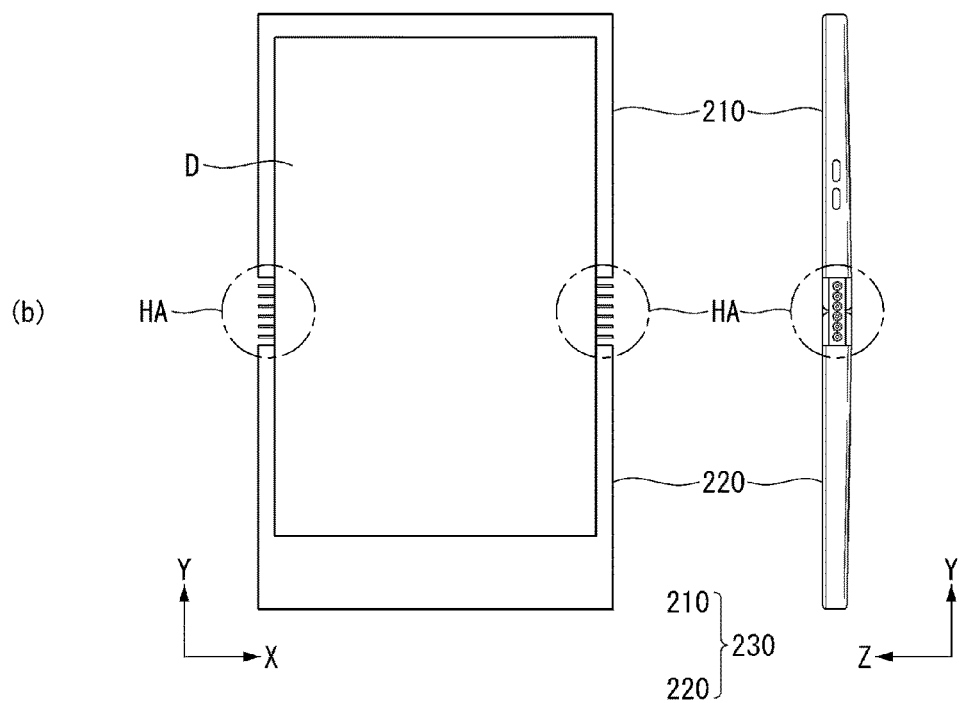

Referring to FIG. 6, a part of the hinge assembly HA may be exposed to the outside. The body 230 may include a first body 210 and a second body 220. FIG. 6 (*a*) shows a front view and a side view of a mobile terminal in which a hinge assembly HA having two axes is disposed. FIG. 6 (*b*) shows a front view and a side view of a mobile terminal in which a hinge assembly HA formed of multiple axes three or more axes is disposed.

When the hinge assembly HA is exposed to the outside, foreign matter or moisture can penetrate into the inside of the mobile terminal. Foreign matter or moisture may cause malfunction of the mobile terminal. The hinge assembly HA can be concealed using the hinge cover 250 as described below.

Figure 7A:
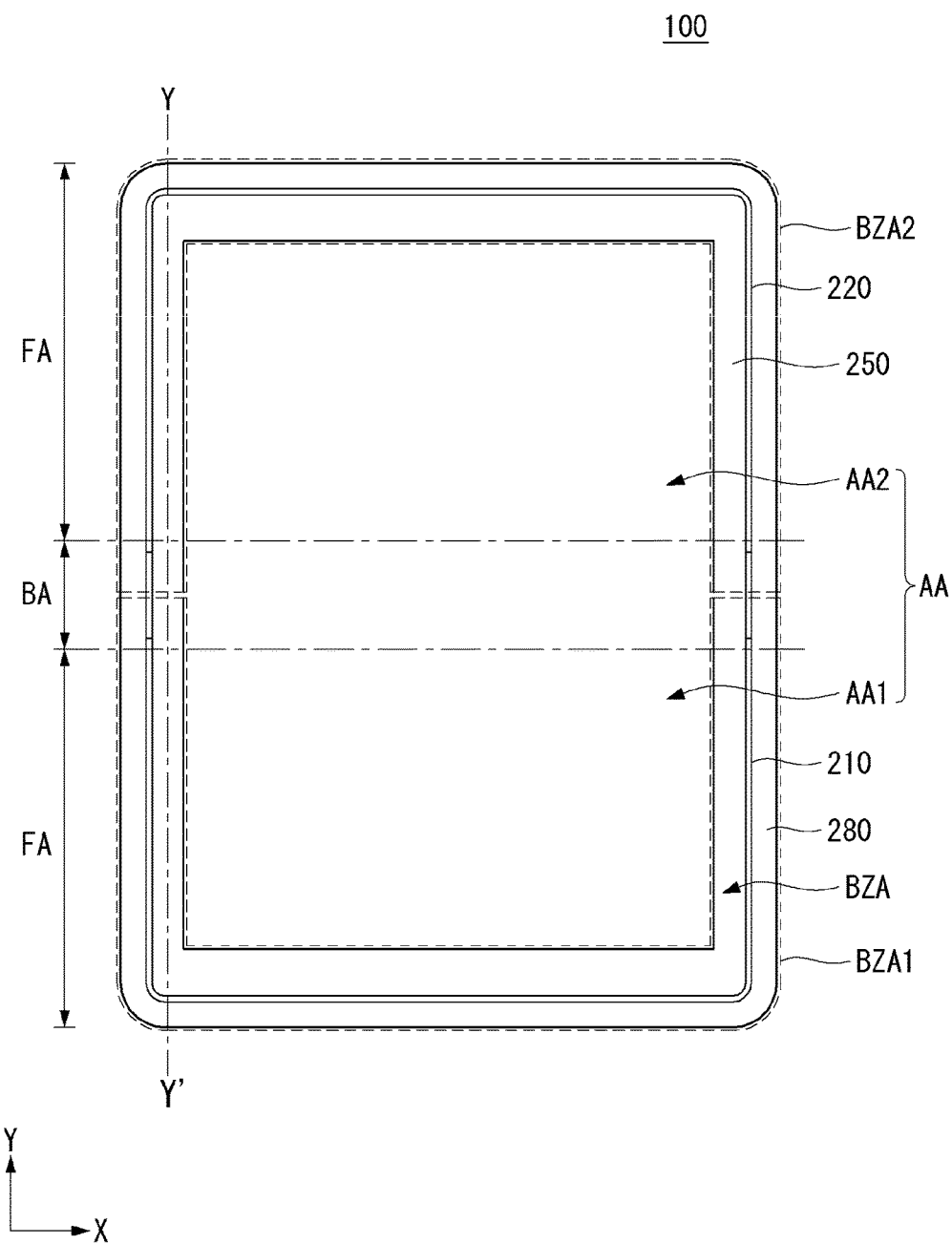
FIG. 7a illustrates a hinge cover attached to a mobile terminal according to an embodiment of the present invention.
Figure 7B:
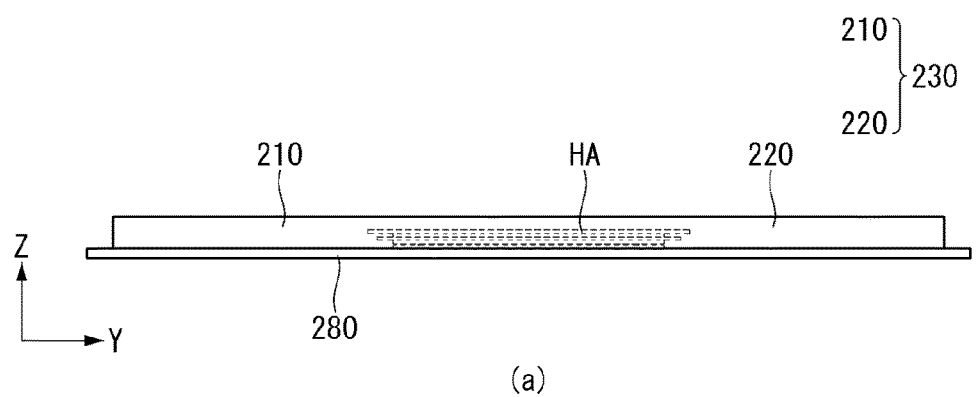
FIG. 7b is a view showing the cut along line Y-Y' in FIG. 7A.
Figure 7B:
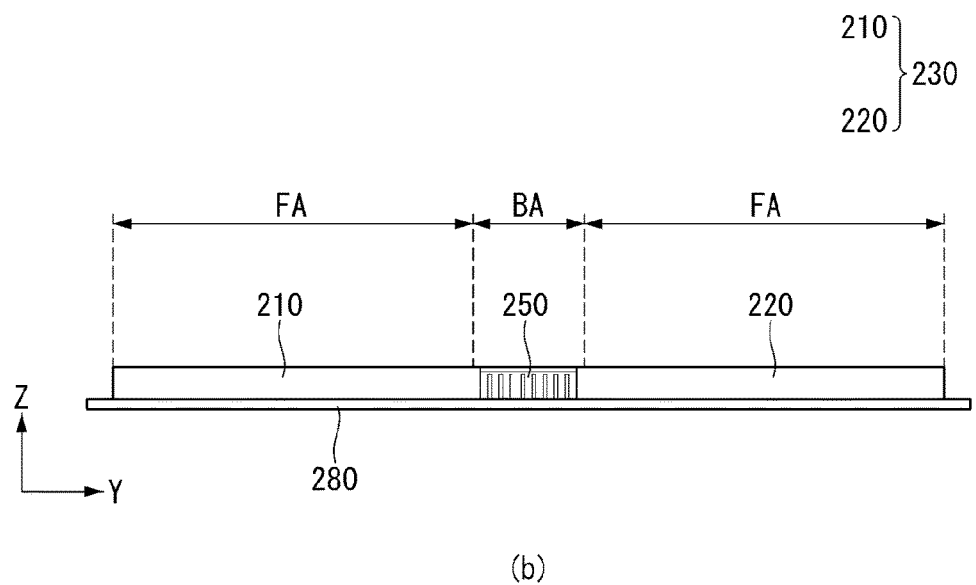

Referring to FIGS. 7a and 7b, the mobile terminal 100 may include a body 230, a hinge assembly HA, a hinge cover 250, and a body cover 280.

The body 230 may include a first body 210 and a second body 220. The first body 210 may be spaced apart from the second body 220.

The body cover 280 may be positioned on the lower surface of the body 230. The body cover 280 can protect the body 280 from an external impact or the like. The body cover 280 may have a shape that surrounds the body 280 in the second state. The area of the body cover 280 may be substantially equal to or greater than the area of the body 230. The body cover 280 can support the body 230.

The display D (see FIG. 5) may be located on the upper surface of the first body 210. The display D (see FIG. 5) may be located on the upper surface of the second body 220. The display D (see FIG. 5) may be located on the upper surface of the bodies 210 and 220. The area of the display D (see FIG. 5) may be smaller than the area of the bodies 210 and 220. The area of the bodies 210 and 220 may include an active area AA and a bezel area BZA. The active area AA may mean an area where the display D (see FIG. 5) is located. In the active area AA, the display D (see FIG. 5) can display a screen. The active area AA may include a first active area AA1 and a second active area AA2. The first active area AA1 may be located in the first body 210. The second active area AA2 may be located in the second body 220. The bezel area BZA may mean an area where the display D (see FIG. 5) is not located. In the first state, the bezel area BZA may have a shape surrounding the active area AA. The bezel area BZA may include a first bezel area BZA1 and a second bezel area BZA2. The first bezel area BZA1 may be located in the first body 210. The second bezel area BZA2 may be located in the second body 220.

The hinge assembly HA may be disposed between the first body 210 and second body 220. The hinge assembly HA may connect the first body 210 and the second body 220 to each other. The hinge assembly HA may operate to change the state of the bodies 210, 220. The hinge assembly HA may be positioned between the first bezel area BZA1 and the second bezel area BZA2. The hinge assembly HA may be located in the banding area BA.

The hinge cover 250 may be fastened to the bezel area BZA such that the hinge assembly HA is covered. The hinge cover 250 may be fastened to the first bezel area BZA1 and the second bezel area BZA2. The hinge cover 250 may be fastened to the front surface or lateral surface of the body 230. The hinge cover 250 fastened to the front surface of the body 230 may be separated from the hinge cover 250 fastened to the lateral surface of the body 230. The hinge cover 250 fastened to the front surface of the body 230 may be integrally formed with the hinge cover 250 fastened to the side surface of the body 230.

The hinge cover 250 may be fastened to the body 230. The hinge cover 250 can be bent or folded. The hinge cover 250 may include a material having high elasticity. The hinge cover 250 may include rubber or silicon.

The hinge cover 250 may have a thickness substantially equal to the thickness of the hinge assembly HA. A detailed description thereof will be described later.

The hinge cover 250 may be disposed on the upper surface and/or the lateral surface of the body 230.

Figure 8:
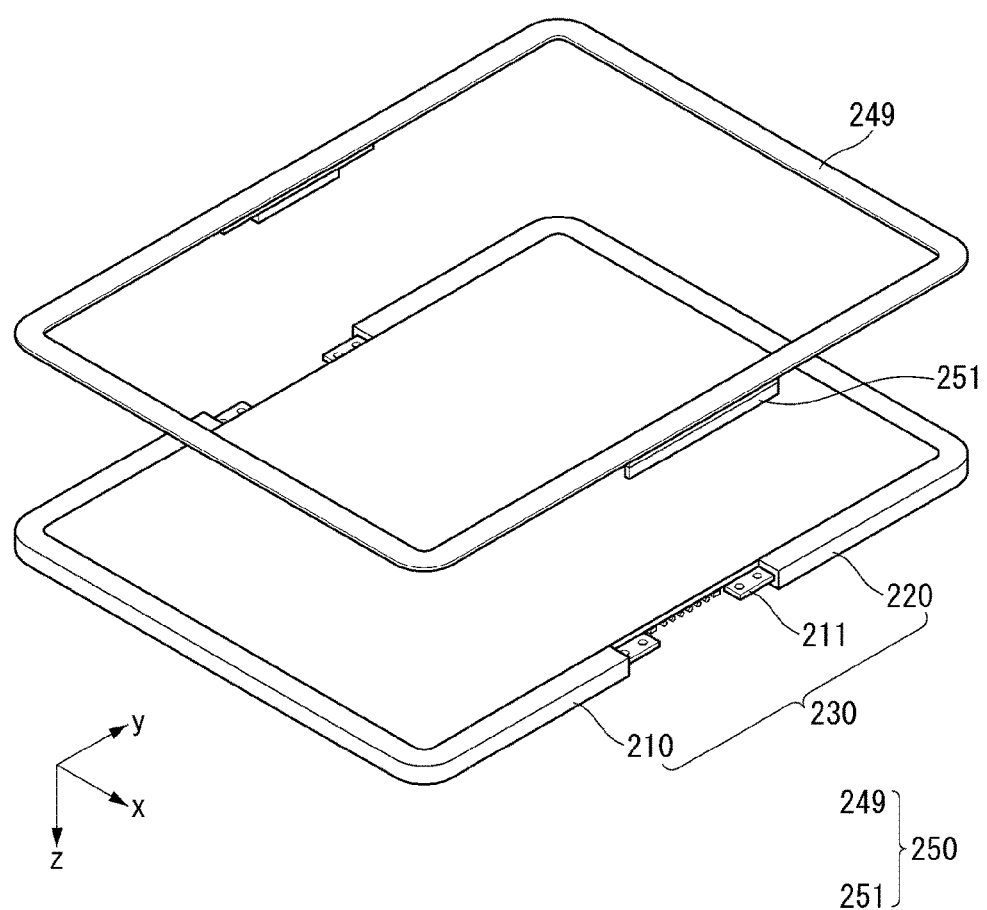
FIG. 8 is a view for explaining the hinge cover shown in FIG. 7A.

Referring to FIG. 8, the hinge cover 250 may include front cover 249 and a lateral cover 251. The hinge cover 250 may have a certain thickness. The front cover 249 may be positioned on the upper surface of the body 230. The width of the hinge cover 250 may be substantially the same as the width of the bezel area BZA (see FIG. 7a). The hinge cover 250 may surround the display D (see FIG. 6). The hinge cover 250 may cover the hinge assembly HA positioned between the first body 210 and the second body 220.

The lateral cover 251 may be disposed below the front cover 249. The lateral cover 251 may be positioned between the first body 210 and the second body 220. The lateral cover 251 can prevent lateral exposure of the hinge assembly HA. The lateral surface of the hinge assembly HA can be oriented in the direction in which the lateral surface of the body 230 faces. The lateral cover 251 may be formed at a position corresponding to the hinge assembly HA. The lateral covers 251 may be provided in plural. The thickness of the lateral cover 251 may be substantially the same as the thickness of the body 230. The lateral cover 251 may cover the hinge assembly HA exposed between the lateral surface of the first body 210 and the lateral surface of the second body 220.

The hinge cover 250 may comprise a polymeric material. The hinge cover 250 may include any one of an elastomer, polyisoprene, polybutadiene, polyisobutylene, and polyurethane.

The front cover 249 may be formed of the same material as the lateral cover 251. The front cover 249 may be formed of a material other than the lateral cover 251. For example, the tensile stress of the lateral cover 251 may be greater than the tensile stress of the front cover 249.

An adhesive layer (not shown) may be disposed between the hinge cover 250 and the body 230. The hinge cover 250 (not shown) may be bonded to the first body 210 and the second body 220 by an adhesive layer. The adhesive layer (not shown) may include a double-sided tape.

The hinge cover 250 may be formed by inserting STS (Stainless Steel) into a area of the first body 210 and the second body 220 excluding the bending area BA (see FIG. 7a). The hinge cover 250 including the metal can be prevented from being deformed and damaged. The hinge cover 250 may be fastened to the body through the double-sided tape.

Figure 9:
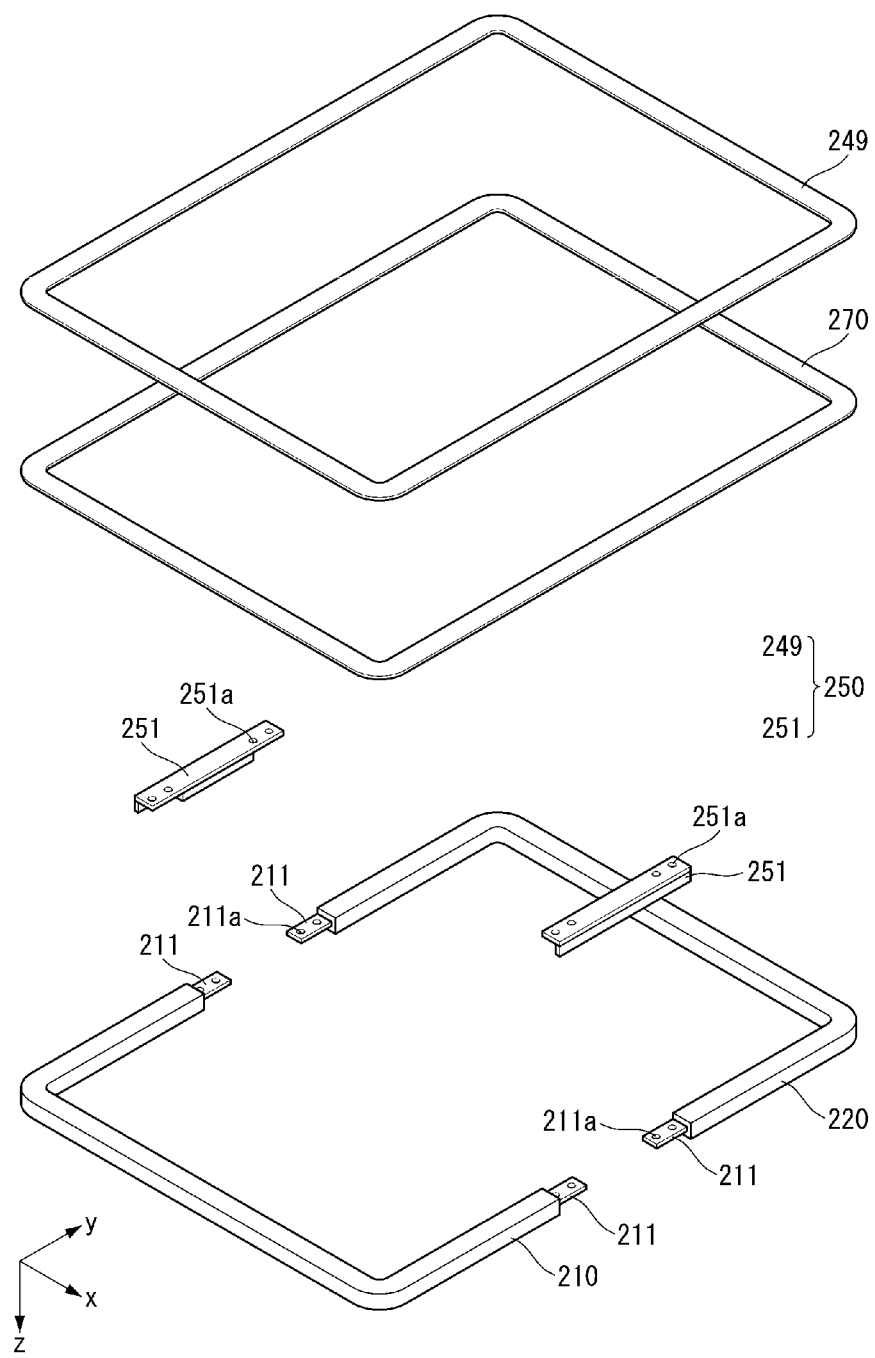
FIG. 9 is an exploded view of FIG. 7A.

Referring to FIG. 9, the mobile terminal according to an embodiment of the present invention may include a hinge cover 250, a film 270, and a body 230. The hinge cover 250 may include a front cover 249 and a lateral cover 251. The lateral cover 251 may be referred to as the hinge cover 250 by itself.

The film 270 may have a certain thickness. The film 270 may be disposed between the front cover 249 and the body 230. The film 270 may be formed to have a width substantially equal to the width of the bezel area BZA (see FIG. 7a). The film 270 may be disposed so as to surround the display D (see FIG. 6) with the same width as the width of the bezel area BZA (see FIG. 7a). The film 270 may be formed in substantially the same shape as the front cover 249 of the hinge cover 250.

The film 270 may comprise polyurethane. When the first body 210 and the second body 220 move in directions away from each other, the front cover 249 may be stretched or broken. The front cover 249 can enhance the tensile stress by inserting the film 270 containing polyurethane.

In the first state, the first body 210 and the second body 220 may be spaced apart from each other at a predetermined interval in the banding area BA (see FIG. 7a). The fastening portion 211 may be formed in the first body 210 and the second body 220. The fastening portion 211 can be fastened to the hinge cover 250. The fastening portion 211 of the first body 210 may have a shape protruding toward the second body 220 in the first state. The fastening portion 211 of the second body 220 may have a shape protruding toward the first body 210 in the first state. The fastening portion 211 may include at least one screw boss 211a. The screw boss 211a can be fastened to the hinge cover 250. The lateral cover 251 may include at least one screw boss 251a. The screw boss 251a of the lateral cover 251 can be disposed corresponding to the position of the screw boss 211a of the fastening portion 251.

Figure 10:
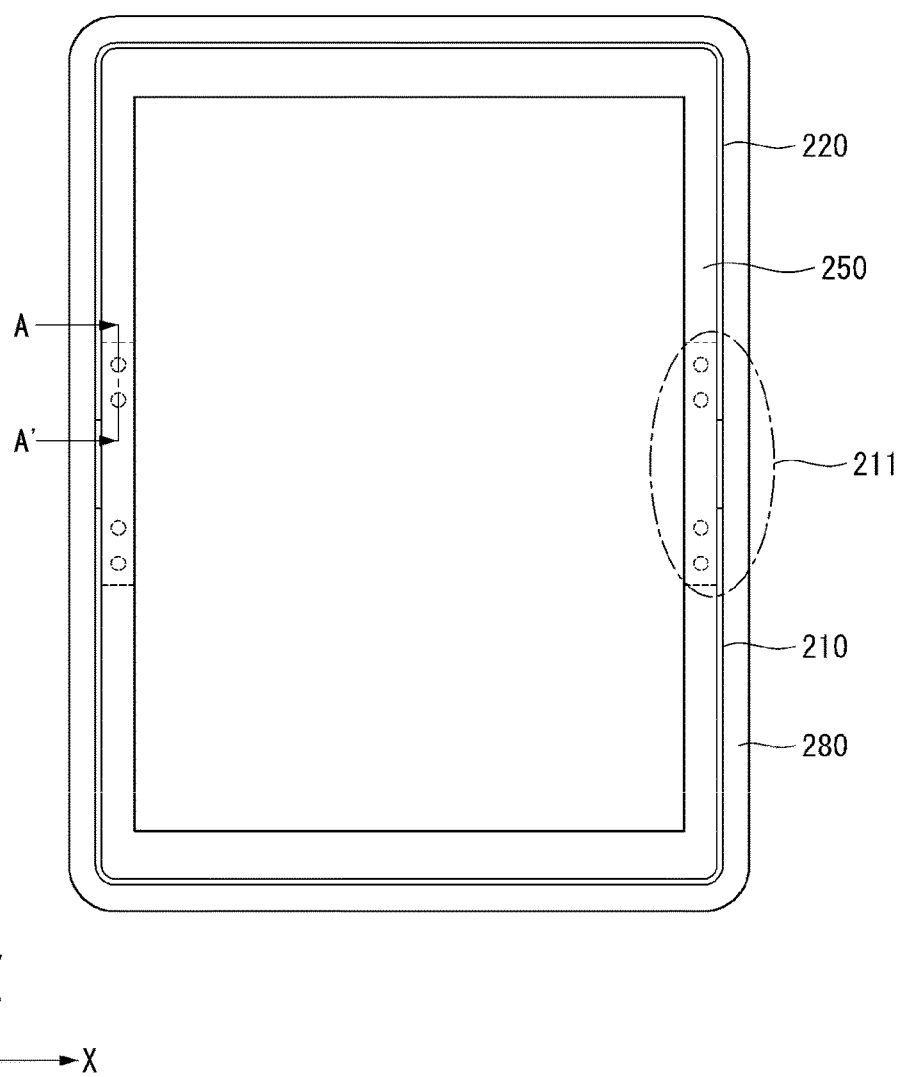
FIG. 10 is a front view of a mobile terminal with a hinge cover according to an embodiment of the present invention.
Figure 11:
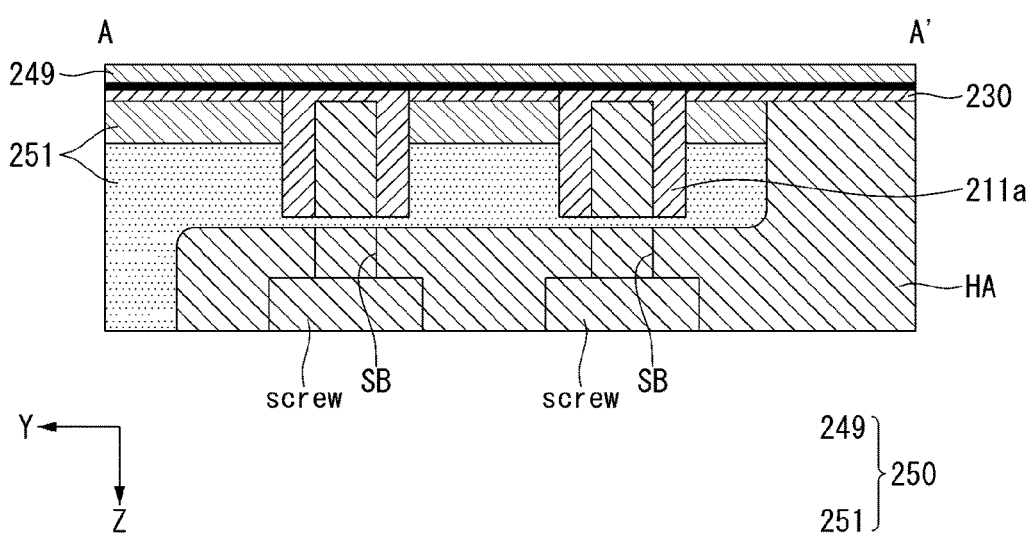
FIG. 11 is a view showing the cut along line Y-Y' in FIG. 10.

Referring to FIGS. 10 and 11, the hinge cover 250 may be fastened to the body 230 through a screw.

The lateral cover 251 may include a screw boss 251a (see FIG. 9). The first body 210 and the second body 220 may include a screw boss 211a. A screw may be inserted into the hinge assembly HA from lower portion of the body 230 toward upper portion of the body 230. The screw inserted into the hinge assembly HA can be fastened to the body 230.

The screw boss 211a formed on the body 230 may be coupled to the body 230 through welding. The screw boss 211a formed in the body 230 can be inserted into the screw boss 251a (see FIG. 9) formed in the lateral cover 251. The screw boss 211a of the body 230 may be disposed corresponding to the position of the screw boss SB formed in the hinge assembly HA. The screw can be sequentially fastened to the screw boss SB of the hinge assembly HA and the screw boss 211a of the body 230.

Figure 12:
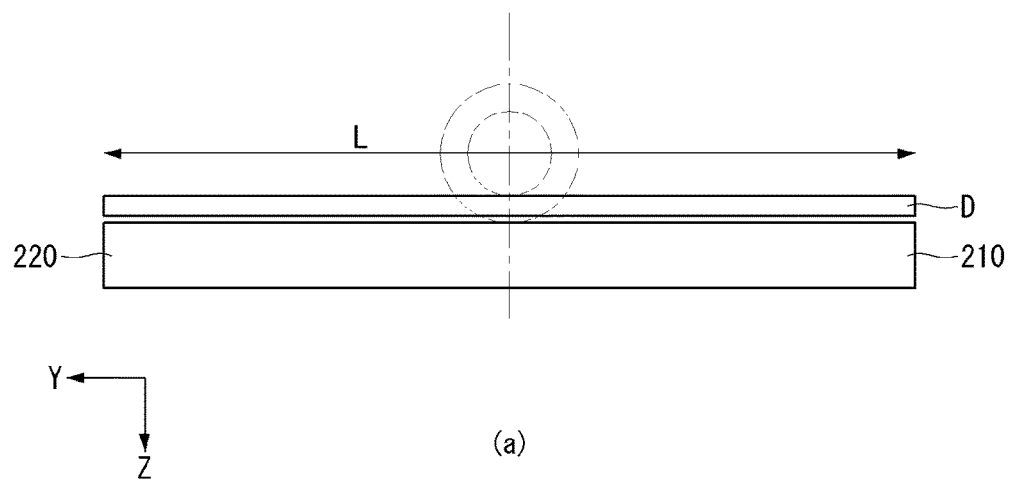
FIG. 12 is a view for explaining a mobile terminal bending according to an embodiment of the present invention.
Figure 12:
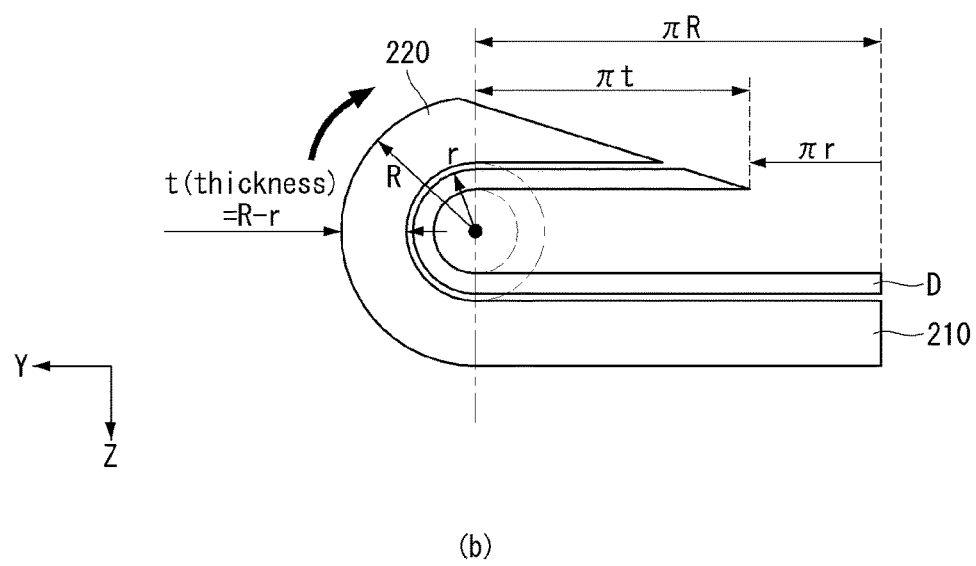

FIG. 12 (a) shows a first state of a mobile terminal according to an embodiment of the present invention. FIG. 12 (b) shows a second state of the mobile terminal according to an embodiment of the present invention. A difference $\pi t$ in length between the inner surface and the outer surface of the body 230 may occur in the process of changing the mobile terminal from the first state to the second state. The length difference $\pi t$ may occur due to the thickness t of the mobile terminal 100. A difference between the first radius r that is the radius to the inner surface of the body 230 and the second radius R that is the radius to the outer surface of the body 230 may occur due to the thickness t.

The difference $\pi t$ in the length t between the inner surface of the body 230 and the outer surface of the body 230 may vary depending on the thickness t of the body 230. The smaller the thickness t of the body is, the smaller the length difference $\pi t$ between the inner surface of the body 230 and the outer surface of the body 230 can be. The greater the thickness t of the body, the larger the length difference $\pi t$ between the inner surface of the body 230 and the outer surface of the body 230 can be.

Due to the difference between the first radius r and the second radius R, wrinkles may occur in the display D in the second state.

In the second state, the display D can be damaged if the first radius r is very small. In the second state, the first radius r may be needed to maintain the shape of the display D. A structure for maintaining the first radius r in the second state may be required.

Figure 13:
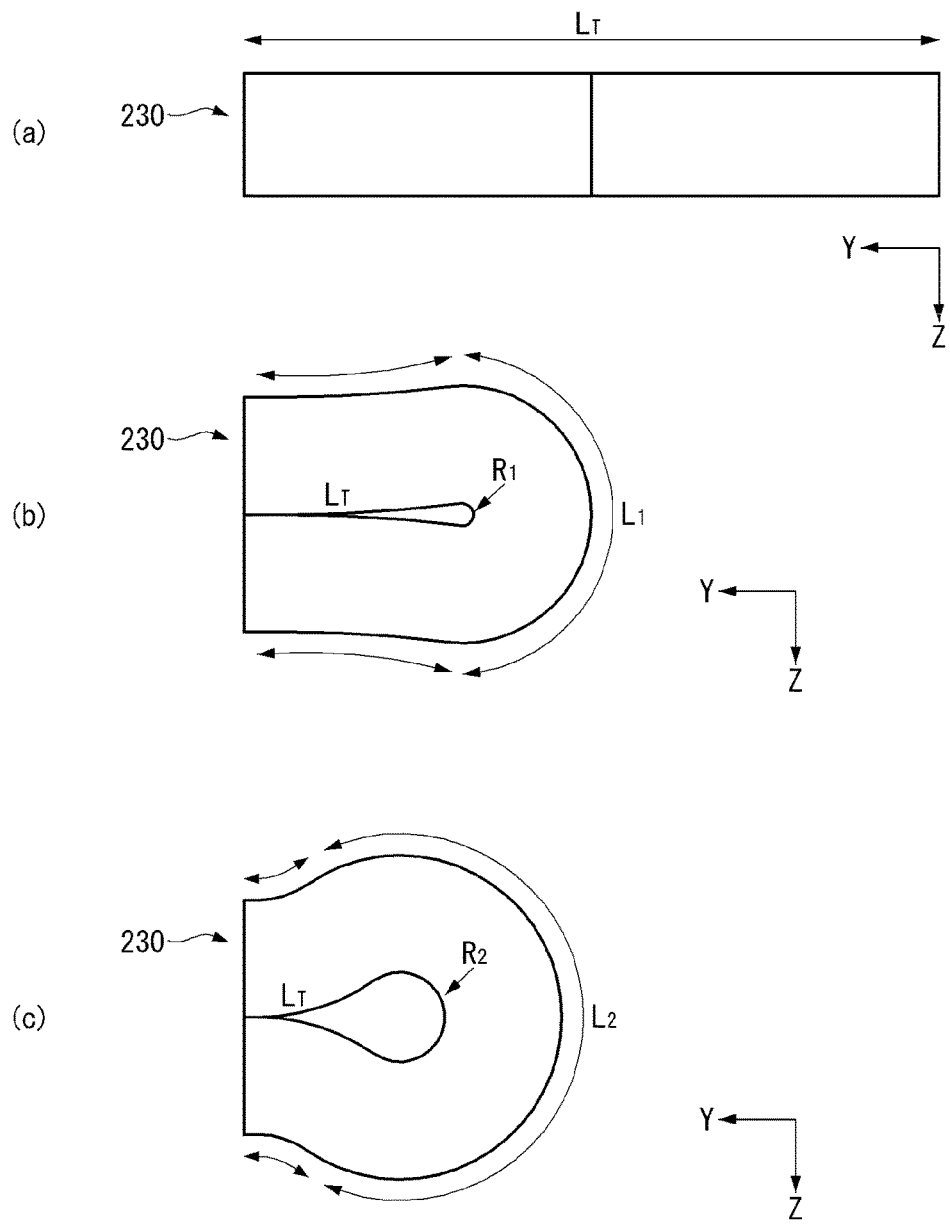
FIG. 13 illustrates that the first radius of a side surface in the body is varied according to an embodiment of the present invention.

FIG. 13 (a) shows a first state of a mobile terminal according to an embodiment of the present invention. FIGS. 13 (b) and 13 (c) show a second state of the mobile terminal according to an embodiment of the present invention.

Even if the first inner radius R1 and second inner radius R2 are different from each other with respect to the inner surface of the body 230, the length $L_T$ of the inner surface of the body 230 may not vary according to the inner radius R1 or R2.

The lengths L1 and L2 of the outer surface of the body 230 may vary depending on the inner diameters R1 and R2 of the body 230. The lengths L1 and L2 of the outer surface of the body 230 may mean the length of the curved surface formed on the outer side of the body 230. The smaller the inner radius R1, R2 of the body 230, the greater the tensile stress on the outer surface of the body 230 can be. The inner radius R2 may be greater than the inner radius R1. The change in the outer length L2 of the body 230 having a large inner radius R2 may be smaller than the change in the outer length L1 of the small body 230 having the inner radius R1.

Figure 14:
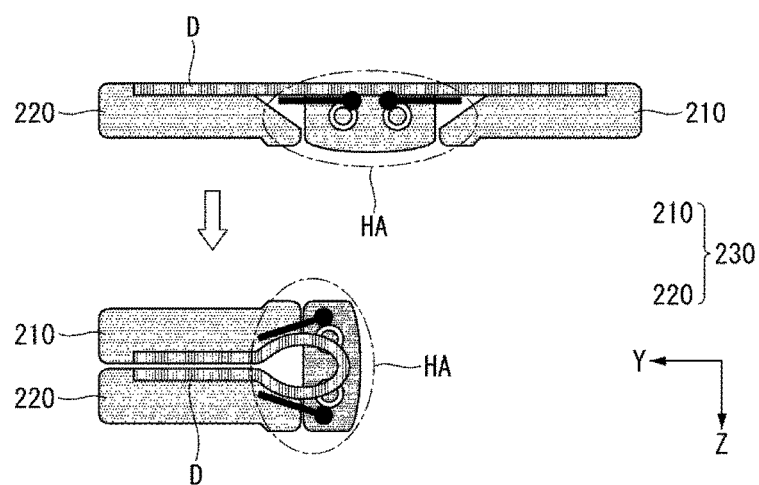
FIG. 14 illustrates a mobile terminal having a biaxial hinge assembly according to an embodiment of the present invention.
Figure 14:
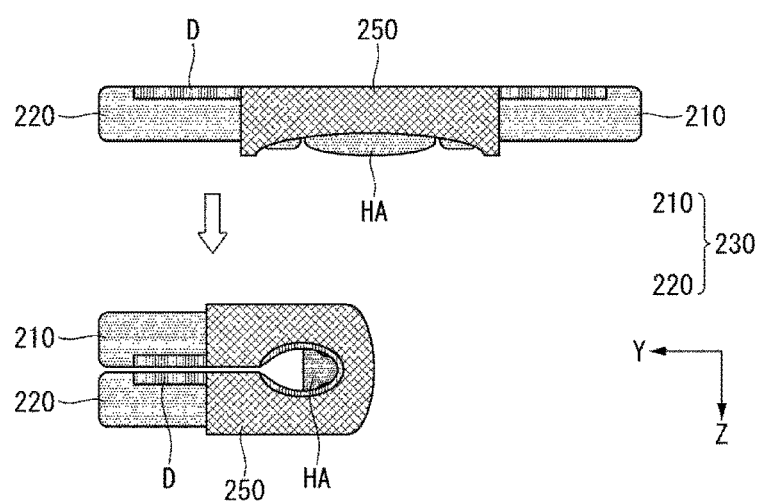

FIG. 14 (a) is a view showing a conventional mobile terminal in which a hinge assembly HA having two axes is disposed. The hinge assembly HA can be exposed to the outside. When the hinge assembly HA is exposed to the outside, foreign matter or moisture can be penetrated into the inside of the mobile terminal.

Referring to FIG. 14 (b), a hinge cover 250 capable of covering the hinge assembly HA can be fastened to the body 220 or the hinge assembly HA. The hinge cover 250 may be disposed on the front surfaces of the bodies 210 and 220. The hinge cover 250 may be disposed so as to cover the banding area BA (see FIG. 7a) between the first body 210 and the second body 220. The hinge cover 250 may be disposed on the first bezel area BZA1 (see FIG. 7a) and the second bezel area BZA2 (see FIG. 7a) of the front surface of the body so as not to overlap with the display D. The hinge cover 250 may be positioned corresponding to the hinge assembly HA.

The hinge cover 250 may include a second surface 250b facing the same direction as the display D in the first state and a first surface 250a disposed opposite the second surface 250b. The first surface 250a may be adjacent to the outer surface of the body 230. The second surface 250b may be adjacent to the inner surface of the body 230. The outer surface of the body 230 may refer to the rear surface of the body 230 in the first state. The inner surface of the body 230 may refer to the front surface of the body 230 in the first state.

Figure 15:
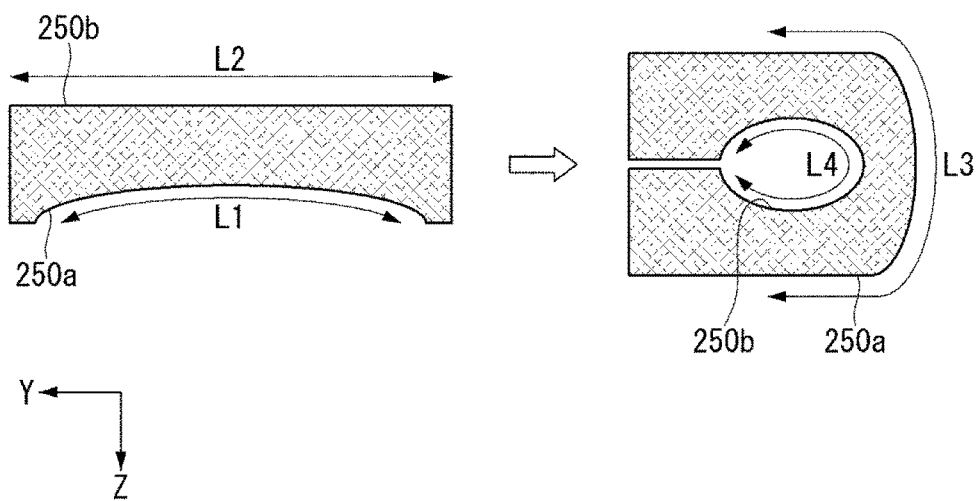
FIG. 15 is a view showing a bending state of a hinge cover according to an embodiment of the present invention.

Referring to FIG. 15, in the first state, the first surface 250a may have a convex shape with respect to the second surface 250b. In the first state, the first surface 250a can be observed as an externally recessed shape. The length L1 of the first surface 250a in the first state may be substantially the same as the length L3 of the first surface 250a in the second state. If the difference in length of the first surface 250a in each state is small, the stress applied to the first surface 250a can be reduced. When the stress applied to the hinge cover 250 is reduced, the change in physical properties of the hinge cover 250 can be reduced. If the stress applied to the hinge cover 250 is reduced, the durability of the hinge cover 250 can be improved. The stress applied to the hinge cover 250 can be applied to the body 230 (see FIG. 11) connected to the hinge cover 250. The stress applied to the hinge cover 250 can suppress the change in the state of the body 230 (see FIG. 11). When the stress applied to the hinge cover 250 is reduced, the property of the body 230 (see FIG. 11) to maintain a state can be improved.

The length L1 of the first surface 250a may be different from the length L2 of the second surface. The lengths L1 and L2 of the outer surface of the body 230 can be changed corresponding to the radii R1 and R2 of the inner surface of the body. The lengths L1 and L2 of the outer surface of the body 230 can be increased as the radiuses R1 and R2 of the inner surface of the body 230 are larger. Accordingly, the length L1 of the first surface according to an embodiment of the present invention is preferably longer than the length L2 of the second surface.

Figure 16:
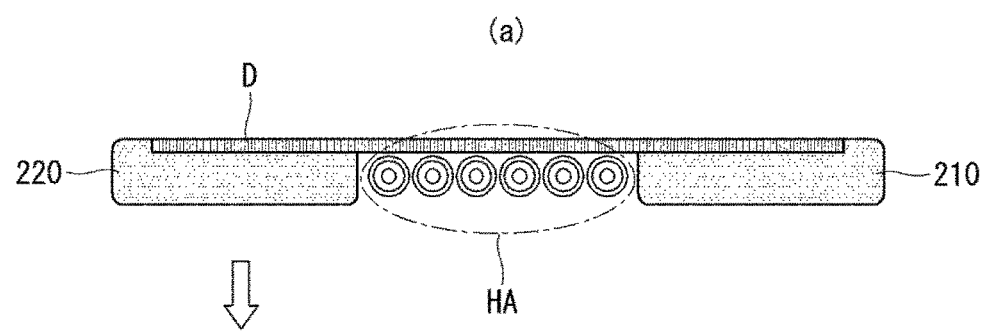
FIG. 16 is a view for explaining a mobile terminal having a multi-axis hinge assembly according to an embodiment of the present invention.
Figure 16:
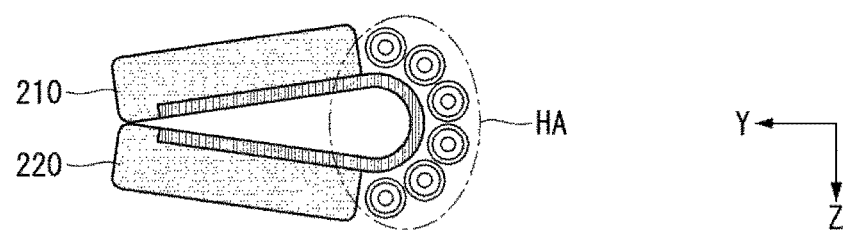
Figure 16:
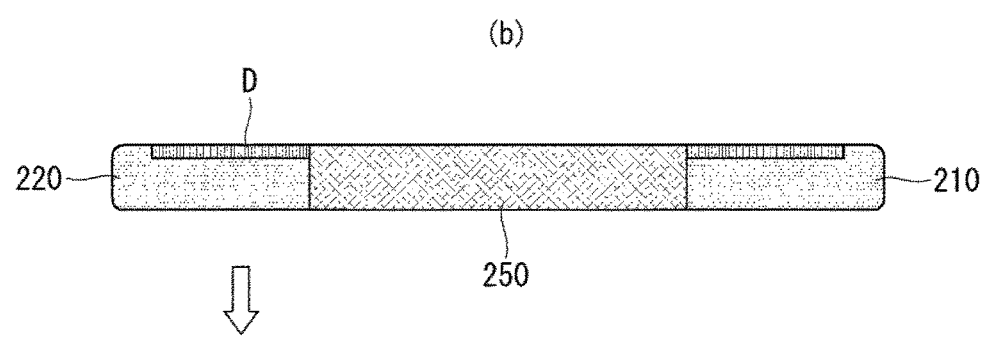
Figure 16:
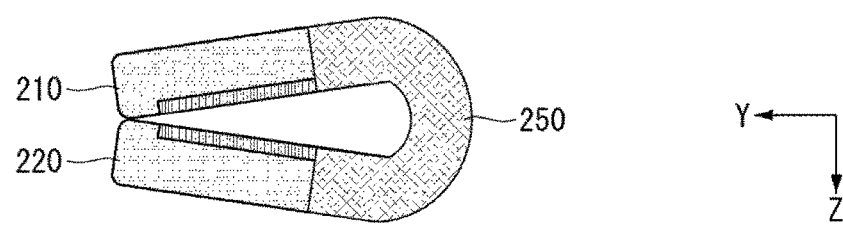
Figure 17:
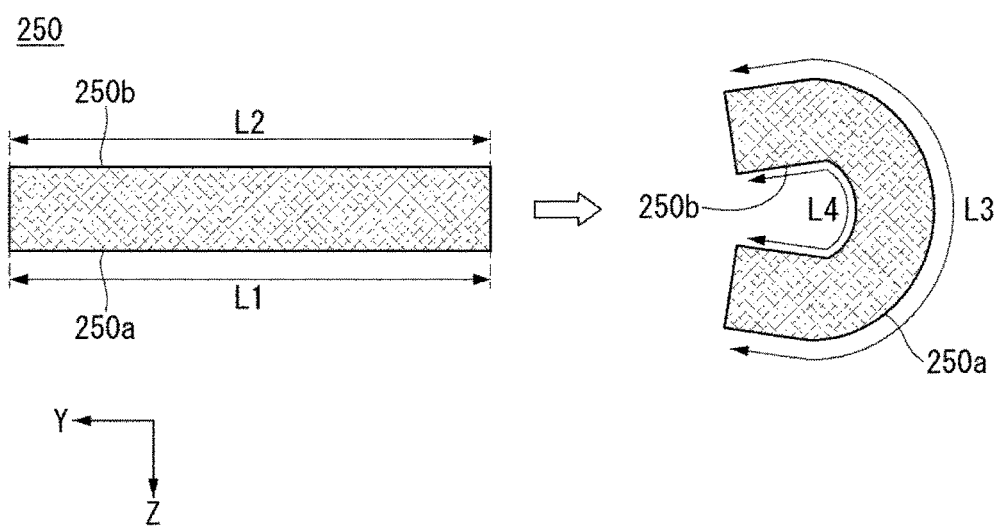
FIG. 17 is a view showing a bending state of the hinge cover according to an embodiment of the present invention.

FIG. 16 is a view for explaining a mobile terminal having a multi-axis hinge assembly HA according to an embodiment of the present invention. FIG. 17 is a view showing a bending state of the hinge cover 250 according to an embodiment of the present invention.

FIG. 16 (a) shows a conventional mobile terminal in which a hinge assembly HA having multiple axes is disposed. In a conventional multi-axis mobile terminal, a gap may be disposed between the first body 210 and the second body 220. The gap may be formed between the adjacent axes of the hinge assembly HA. The gap formed in the hinge assembly HA can be exposed to the outside. When the gap formed in the hinge assembly HA is exposed to the outside, foreign matter or moisture may be penetrated into the inside of the mobile terminal. The hinge assembly HA exposed to the outside may cause malfunction due to foreign matter or moisture.

FIG. 16 (b) shows a mobile terminal according to an embodiment of the present invention including a hinge cover 250 that can cover a multi-axial type hinge assembly HA. The hinge cover 250 may be disposed on the front surface of the first body 210 and the second body 220. The hinge cover 250 may be arranged to cover the banding area BA (see FIG. 7a) between the first body 210 and the second body 220. The hinge cover 250 may be disposed on the first bezel area BZA1 (see FIG. 7a) and the second bezel area BZA2 (see FIG. 7a) of the front surface of the body 230 so as not to overlap with the display D.

Referring to FIG. 17, in the first state, the length L1 of the first surface 250a may be substantially equal to the length L2 of the second surface 250b. In the second state, the length L3 of the first surface 250a may be different from the length L4 of the second surface 250b. The length L3 of the first surface 250a in the second state may be greater than the length L1 of the first surface 250a in the first state.

The modulus of the first face 250a may be different from the modulus of the second face 250b. The modulus of the first surface 250a may be less than the modulus of the second surface 250b. If the modulus of the second surface 250b is greater than the modulus of the first surface 250a, the state of the hinge cover 250 can be more easily maintained.

Figure 18:
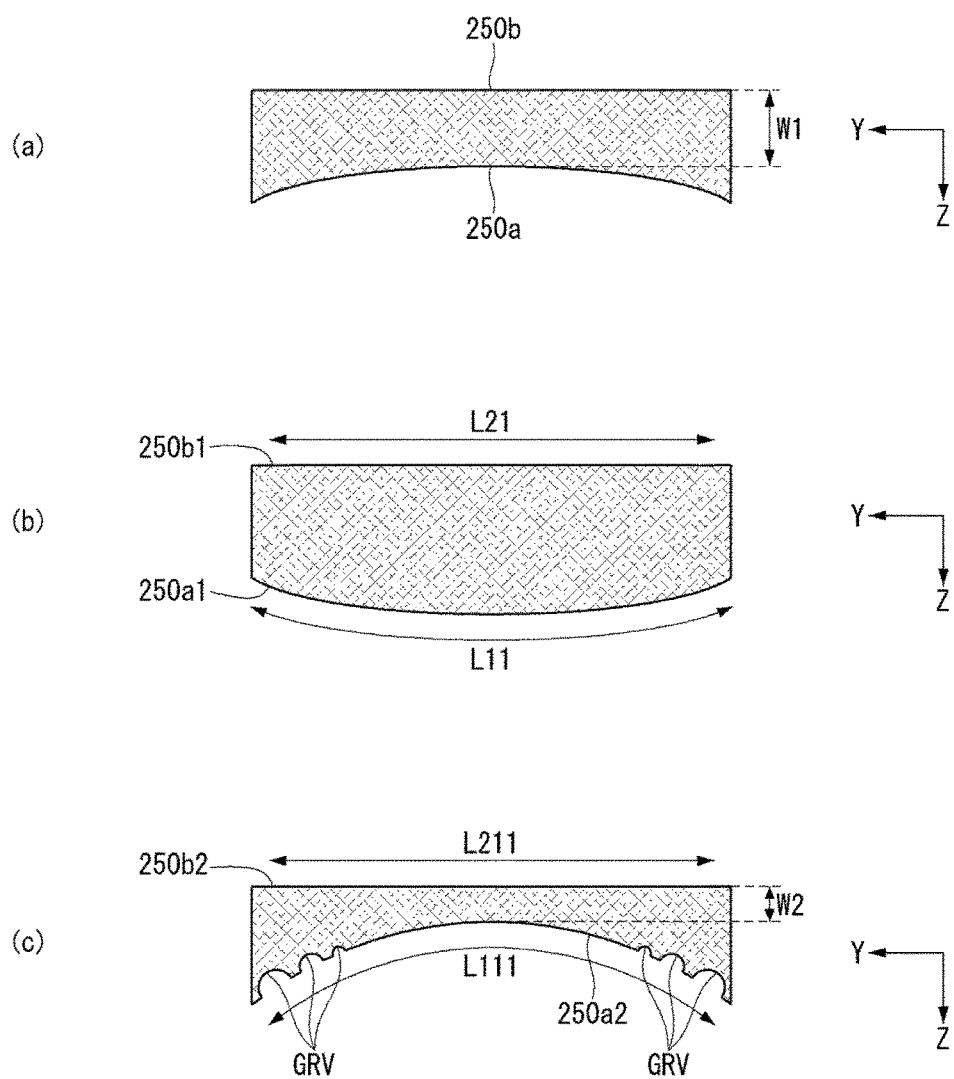
FIG. 18 is a view for explaining a hinge cover according to another embodiment of the present invention.

Referring to FIG. 18 (a), the hinge cover 250 may include a first surface 250a and a second surface 250b. The first surface 250a represents the outer surface of the hinge cover 250 and the second surface 250b may represent the inner surface of the hinge cover 250. The outer surface of the hinge cover 250 may stand for a surface of the hinge cover 250 which faces the outside in second state. The inner surface of the hinge cover 250 may stand for a surface of the hinge cover 250 opposite to the outer surface of the hinge cover 250.

The second surface 250b may be formed in a flat shape. The first surface 250a may be convexly formed in a direction from the first surface 250a toward the second surface 250b. In another aspect, the first surface 250a is concave in perspective of the outside of the hinge cover 250. The hinge cover 250 may have a smaller thickness toward the center.

The length of the first surface 250a may be greater than the length of the second surface 250b. The lengths of the first surface 250a and second surface 250b is in a direction from the first body 210 (see FIG. 16) toward the second body 220 (see FIG. 16) in first state.

When the hinge cover 250 is changed from the first state to the second state, a change in the length of the first surface 250a may be greatest at the center of the hinge cover 250. When the thickness W1 of the central portion of the hinge cover 250 is reduced, the change in length of the first surface 250a can be reduced. When the change in length of the first surface 250a is reduced, cracking and/or wrinkling of the hinge cover 250 can be reduced.

Referring to FIG. 18 (b), the hinge cover 250 may include a first surface 250a1 and a second surface 250b1. The second surface 250b1 may be formed in a flat shape. The first surface 250a1 may be concave in a direction from the first surface 210a1 toward the second surface 250b1. The first surface 250a1 is convex in perspective of the outside of the hinge cover. The hinge cover 250 may have a larger thickness toward the central portion of the hinge cover 250. Thus, the length L11 of the first surface 250a1 may be greater than the length L21 of the second surface 250b1.

Referring to FIG. 18 (c), the hinge cover 250 may include a first surface 250a2 and a second surface 250b2. The second surface 250b2 may be formed in a flat shape, and the first surface 250a2 may be convex in a direction from the first surface 250a2 toward the second surface 250b2. The first surface 250a2 may be concave from perspective of the outside of the hinge cover 250. The first surface 250a2 may have at least one groove GRV. The hinge cover 250 may have a smaller thickness toward the central portion of the hinge cover 250. The hinge cover 250 may have a smallest thickness W2 at the central portion of the hinge cover 250. The groove GRV formed on the first surface 250a2 can compensate the length of the first surface 250a2 in the second state.

The thickness of the hinge cover 250 may vary depending on the difference between the length L111 of the first surface 250a2 and the length L211 of the second surface 250b2. Under the hypothesis that the thickness of the hinge cover 250 at its ends are constant, the greater the difference between the length L111 of the first surface 250a2 and the length L211 of the second surface 250b2, the smaller the thickness W2 of the hinge cover 250 may be.

Figure 19:
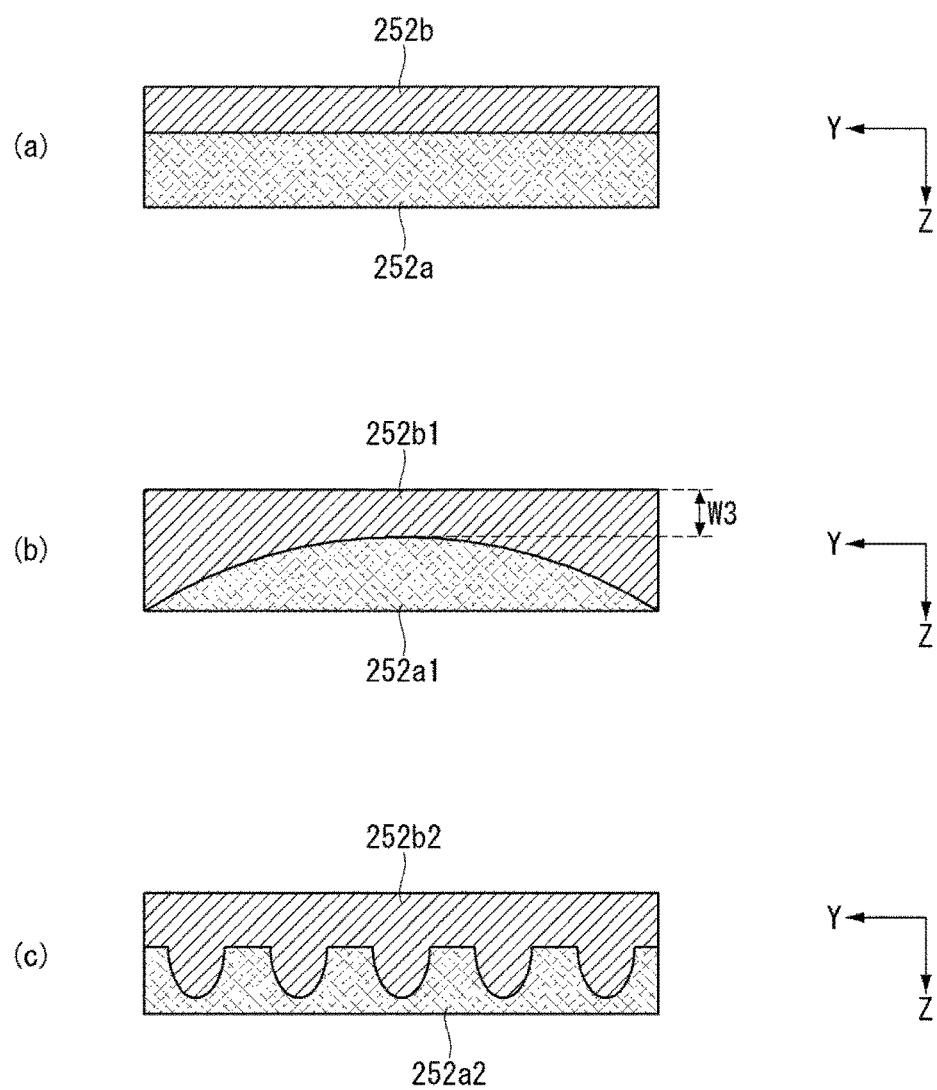
FIG. 19 is a view for explaining a hinge cover having multi-layers according to another embodiment of the present invention.

Referring to FIG. 19, the hinge cover 250 according to an embodiment of the present invention may include at least one layer. Each of the plurality of layers may have a different modulus.

Referring to FIG. 19 (a), the lower surface of the first layer 252a may be fastened to the body 230 (see FIG. 11) or the hinge assembly HA (see FIG. 11). The upper surface of the first layer 252a may be fastened to the lower surface of the second layer 252b. The upper surface of the second layer 252b may be exposed to the outside.

The first layer 252a may have a lower hardness than the second layer 252b. When the hardness of the first layer 252a is low, the tensile force generated in the first layer 252a can be reduced. If the hardness of the second layer 252b is low, the shape of the second layer 252b can be easily deformed by external pressure. If the hardness of the second layer 252b is high, the second layer 252b can resist external pressure.

If the second layer 252b has a higher hardness than the first layer 252a, a high compressive stress can be generated in the second state. The thickness of the second layer 252b may be smaller than the thickness of the first layer 252a so that the compressive stress of the second layer 252b may be reduced.

Referring to FIG. 19 (b), the interface between the first layer 252a1 and the second layer 252b1 may have a concave shape. The second layer 252b1 can reduce the thickness W3 at central portion of the second layer 252b. When the thickness of the second layer 252b is reduced, the compressive stress on the second layer 252b can be reduced.

Referring to FIG. 19 (c), the interface between the first layer 252a2 and the second layer 252b2 may have a shape of unevenness. The interface between the first layer 252a2 and the second layer 252b2 may be increased as a whole. When the interface between the first layer 252a2 and the second layer 252b2 is increased, the stress generated in the second layer 252b2 can be efficiently absorbed in the first layer 252a2.

The hinge cover 250 may include an elastic material such as various silicone or urethane.

Figure 20A:
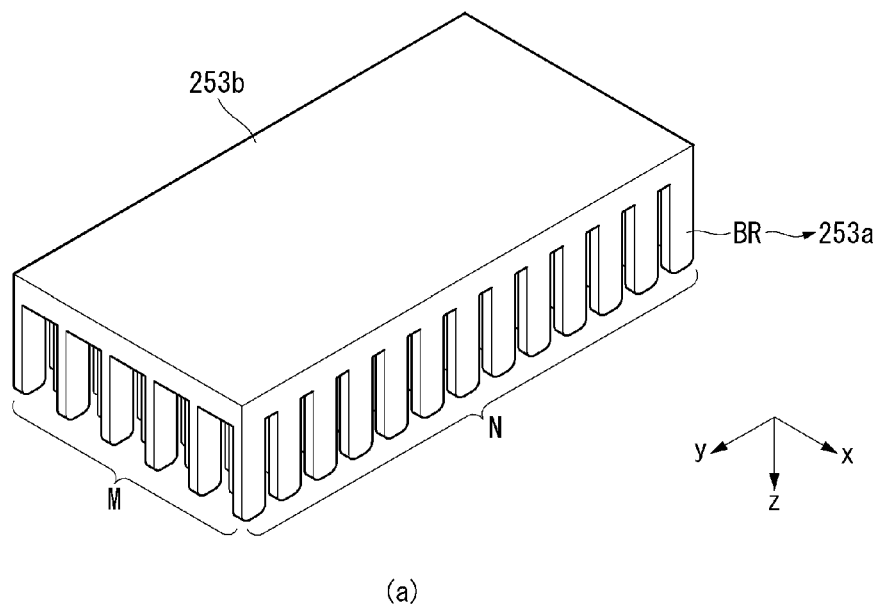
FIGS. 20a to 20c are views for explaining a hinge cover having a plurality of bar according to another embodiment of the present invention.
Figure 20A:
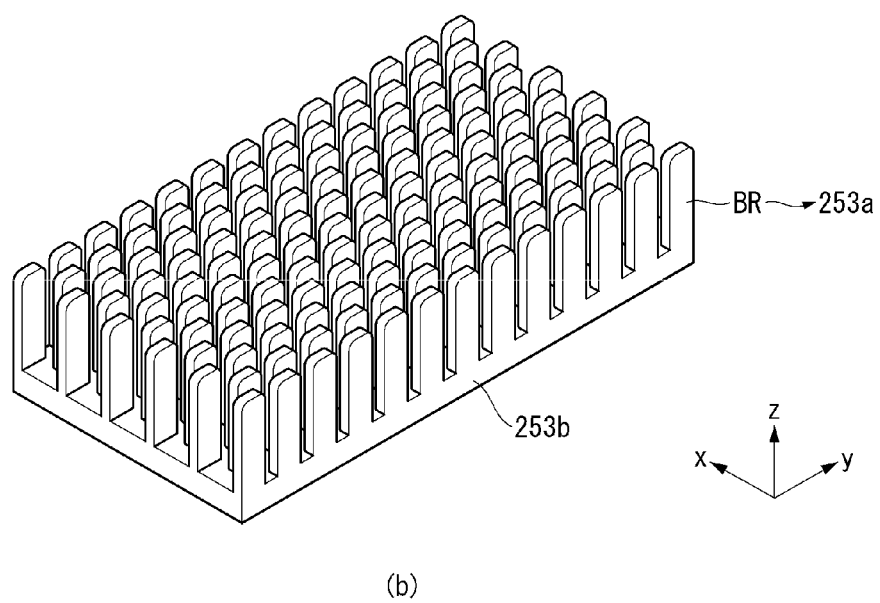
Figure 20B:
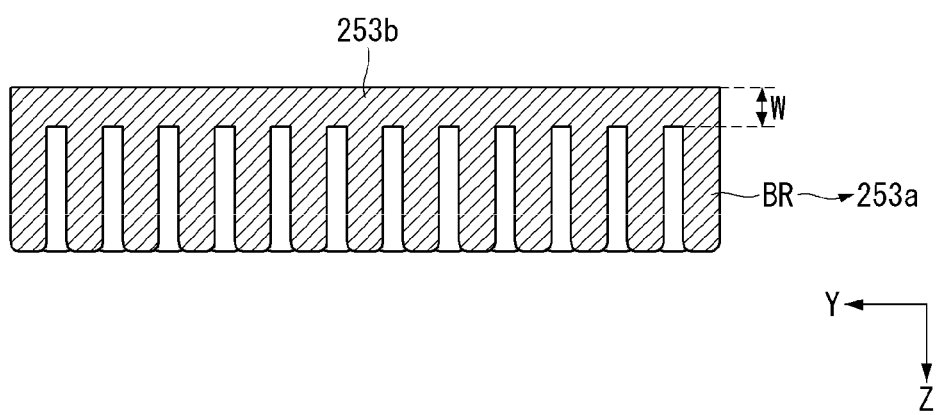

Referring to FIG. 20a, a hinge cover 250 according to another embodiment of the present invention has a skirt structure. FIG. 20a (a) is a front perspective view. FIG. 20a (b) is a rear perspective view.

The first layer 253a may include a plurality of bars BR. The second layer 253b may be located above the first layer 253a. The second layer 253b may have a certain thickness. The bar BR may have a certain height, thickness and width.

The plurality of bars BR may be arranged in an M-by-N matrix (M, N is a natural number). The plurality of bars BR may be arranged according to rows and columns. The plurality of bars BR may be staggered.

The length of the outer surface of the hinge cover 250 can be freely changed when it is converted from the first state to the second state. The other ends of the plurality of bars BR can be separated from each other in the second state. When the other ends of the plurality of bars BR are separated, the stress may hardly be generated while the hinge cover 250 is being changed from the first state to the second state. When the hinge cover 250 is formed in a skirt structure, the thickness of the second layer 253b can be minimized.

Figure 20C:
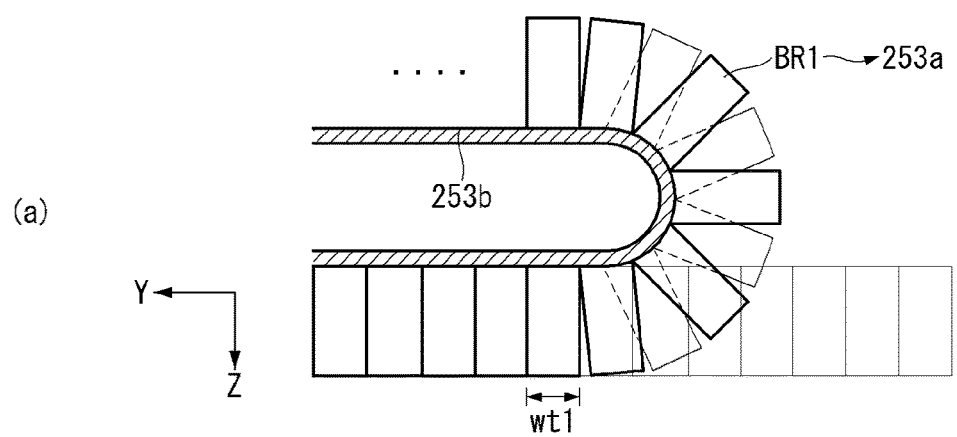
Figure 20C:
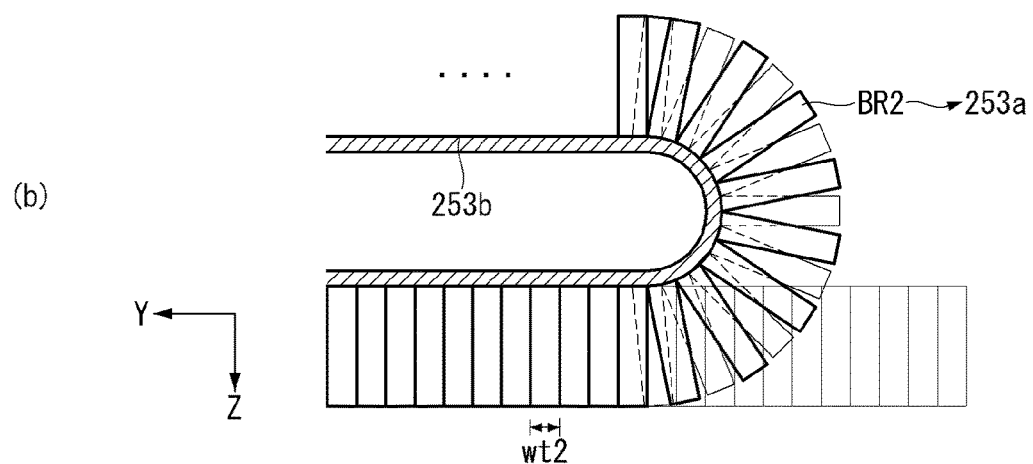

Referring to FIG. 20c, the state of the first layer 253a in the second state may be changed according to the width of the bar BR.

Referring to FIG. 20c (a), the first layer 253a may include a plurality of first bars BR1. The first bar BR1 may have a first width wt1. Referring to FIG. 20c (b), the first layer 253a may include a plurality of second bars BR2. And the second bar BR2 may have a second width wt2. The first width wt1 may be greater than the second width wt2.

If the first width wt1 is larger than the second width wt2, the number of the first bars BR1 may be smaller than the number of the second bars BR2. The hinge cover 250 of the present invention may vary the number of bar BR depending on the width of the bar BR.

Figure 21:
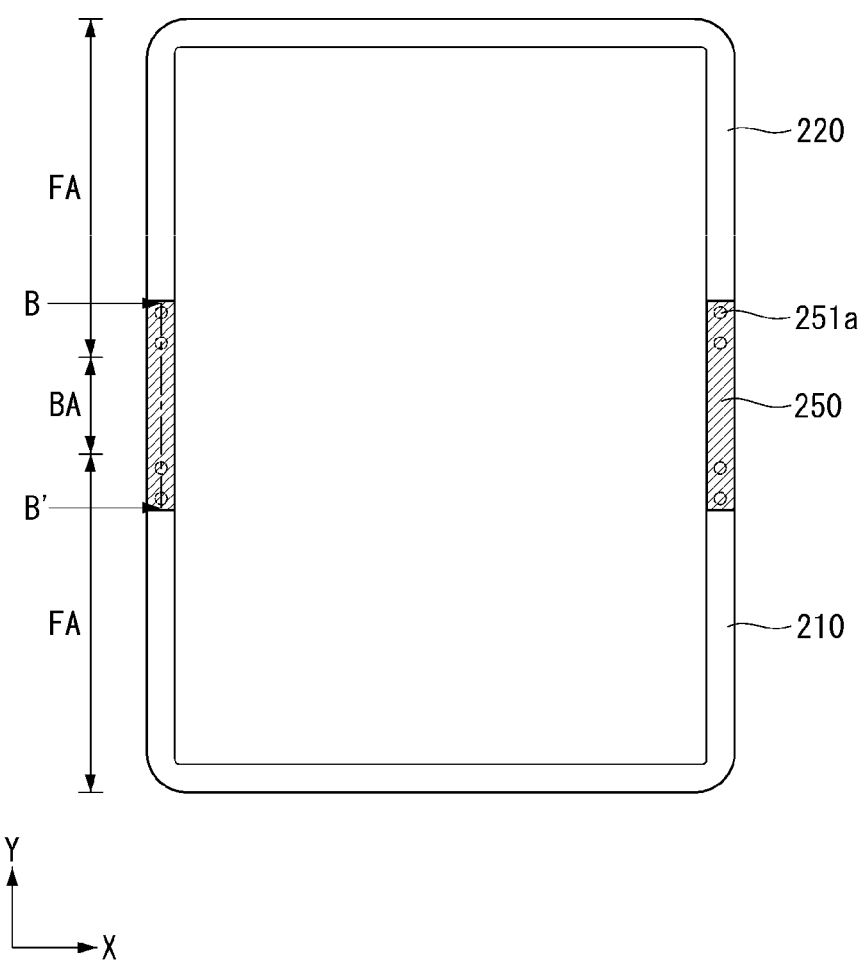
FIG. 21 illustrates a mobile terminal of which hinge cover is relatively short according to another embodiment of the present invention.

FIG. 21 illustrates a hinge cover 250 attached to a mobile terminal according to another embodiment of the present invention.

Referring to FIG. 21, the hinge cover 250 may be fastened to the bodies 210 and 220 so as to be in close contact with the bodies 210 and 220. The hinge cover 250 may include a collapsible material. The hinge cover 250 may include a material having high elasticity. The hinge cover 250 may include rubber or silicon.

The hinge cover 250 may have a thickness corresponding to the thickness of the hinge assembly HA (see FIG. 5) to cover the hinge assembly HA (see FIG. 5) exposed to the outside from the sides of the bodies 210 and 220.

If the hinge cover 350 is disposed only on a part of the front surface of the body, the product cost can be lowered and the processing time can be shortened.

Figure 22:
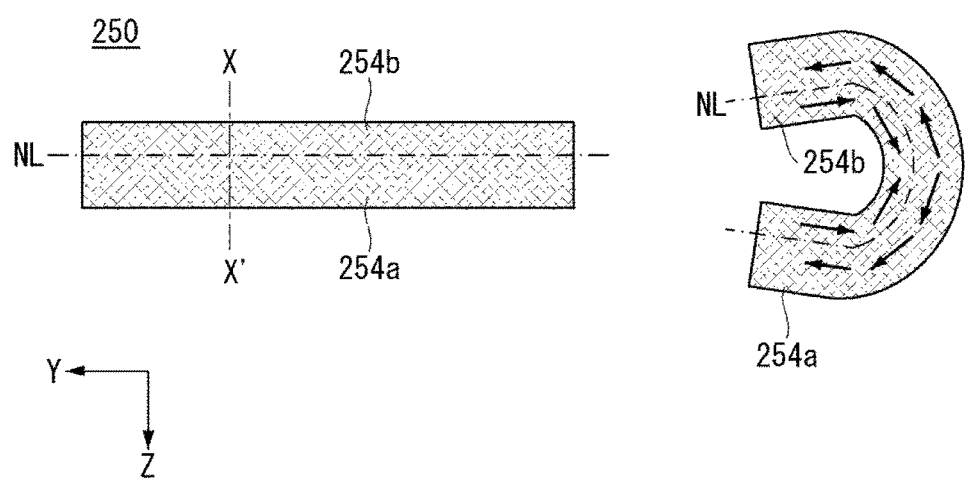
FIG. 22 is a view for explaining the hardness of the hinge cover according to the embodiment of the present invention.
Figure 23:
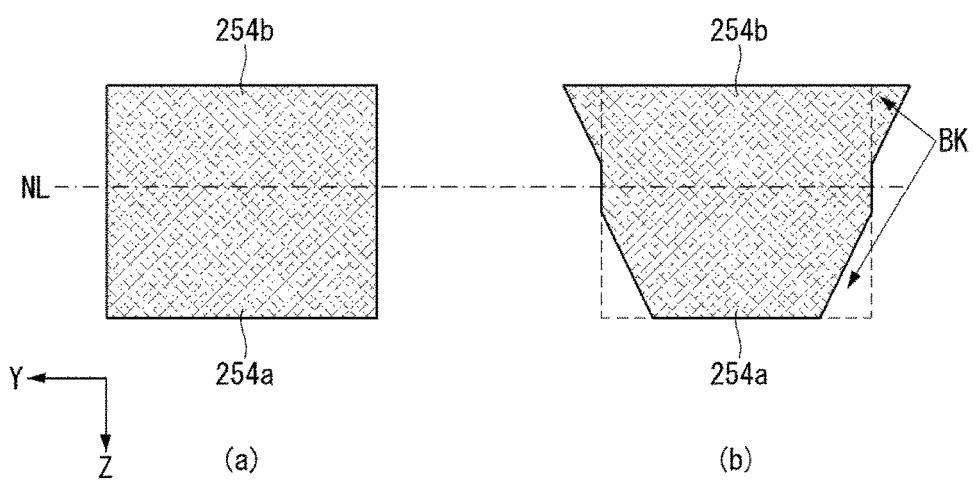
FIG. 23 is a view showing the cut along the line XX' in FIG. 22.
Figure 23:
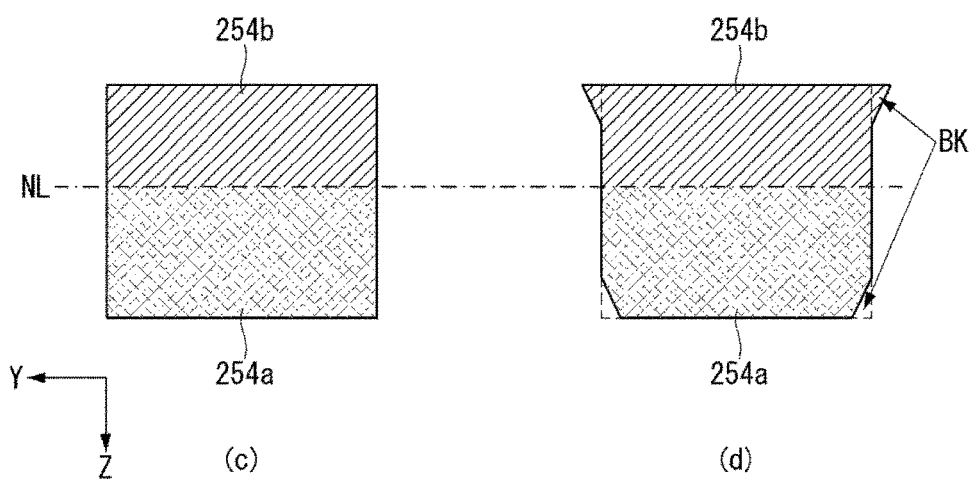

FIG. 22 is a view showing the cut along the line B-B' of FIG. 21 is cut. FIG. 23 is a view showing the cut along the line XX' in FIG. 22. FIG.

Referring to FIG. 22, the hinge cover 250 may include at least one layer. The hinge cover 250 may include a first layer 254a and a second layer 254b. The adhesive layer may be positioned between the first layer 254a and the second layer 254b.

A neutral plane NL may be disposed between the first layer 254a and the second layer 254b. The first layer 254a and the second layer 254b may be formed of the same material or different materials. The neutral plane NL may refer to a virtual plane that does not generate stress due to bending.

When the first layer 254a and the second layer 254b are formed of the same material, the neutral plane NL is determined by the thickness of the first layer 254a and the thickness of the second layer 254b.

The first layer 254a and the second layer 254b may be formed of different materials. The first layer 254a may have a first thickness. The second layer 254b may have a second thickness. The neutral plane NL may be positioned between the first layer 254a and the second layer 254b.

Here, each of the first layer 254a and the second layer 254b formed of different materials may be laminated. The first layer 254a and the second layer 254b may minimize the thickness to reduce the tensile force.

When converting to the first state or the second state, different kinds of stresses may be generated in the hinge cover 250 based on the neutral plane NL. A compressive stress may be generated at one side of the hinge cover 250 with respect to the neutral plane NL and a tensile stress may be generated at the other side of the hinge cover 250 when the first state or the second state is converted.

Referring to FIG. 23 (a), the first layer 254a may be formed of the same material as the second layer 254b.

Referring to FIG. 23 (b), a volume increase deformation may occur in the second layer 254 b due to the compressive stress in the second state. In the second state, volume reduction deformation may occur in the first layer 254a due to tensile stress. A buckling BK in which the volume decreases in the first layer 254a may occur. Buckling BK in which the volume increases in the second layer 254b may occur.

As the hardness of the layer increases, the buckling BK may decrease. The hardness of the first layer 254a may be different from the hardness of the second layer 254b. The hardness of the second layer 254b may be higher than the hardness of the first layer 254a.

Referring to FIG. 23 (c), the hardness of the second layer 254b may be greater than the hardness of the first layer 254a. The neutral plane NL may be positioned between the first layer 254a and the second layer 254b.

While the neutral plane NL may not be located between the first layer 254a and the second layer 254b. In this case, compressive stress occurs at one side of the hinge cover 250 with respect to the neutral plane NL, and tensile stress may occur at the other side of the hinge cover 250. In this case, if the modulus of the first layer 254a and that of the second layer 254b are different, the movement of the first layer 254a and the second layer 254b at the interface may be different from each other. If the movement of the first layer 254a and the second layer 254b on the interface between the first layer 254a and the second layer 254b is different from that of the first layer 254a and the second layer 254b, Cracks may occur.

Referring to FIG. 23 (d), buckling BK may occur in the hinge cover 250. The buckling BK shown in FIG. 23 (d) can be smaller than the buckling BK shown in FIG. 23 (c).

In order to reduce the volume of the buckling BK generated in the hinge cover 250, an elastomer having a high modulus may be used.

Figure 24:
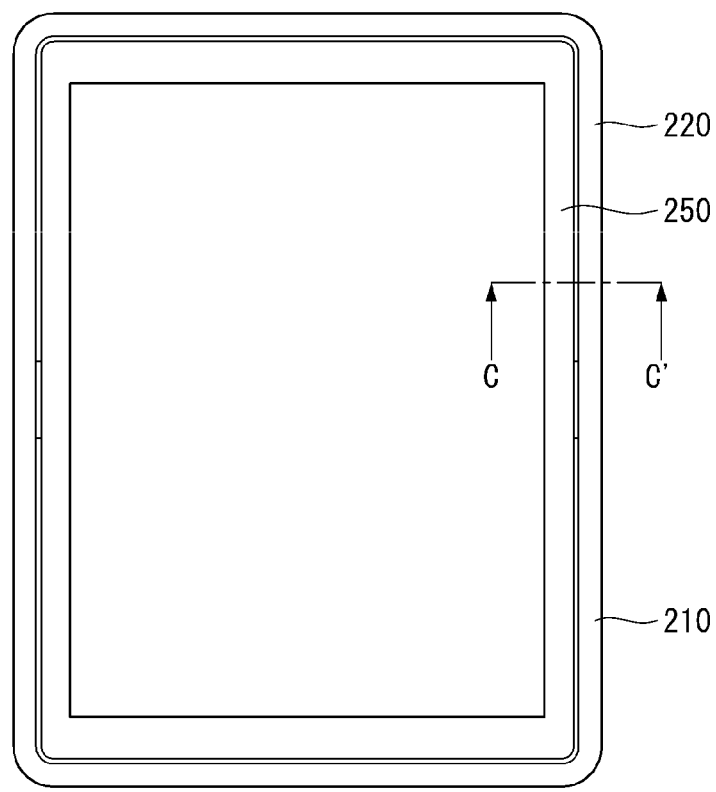
FIG. 24 is a front view of a mobile terminal according to an embodiment of the present invention.
Figure 25:
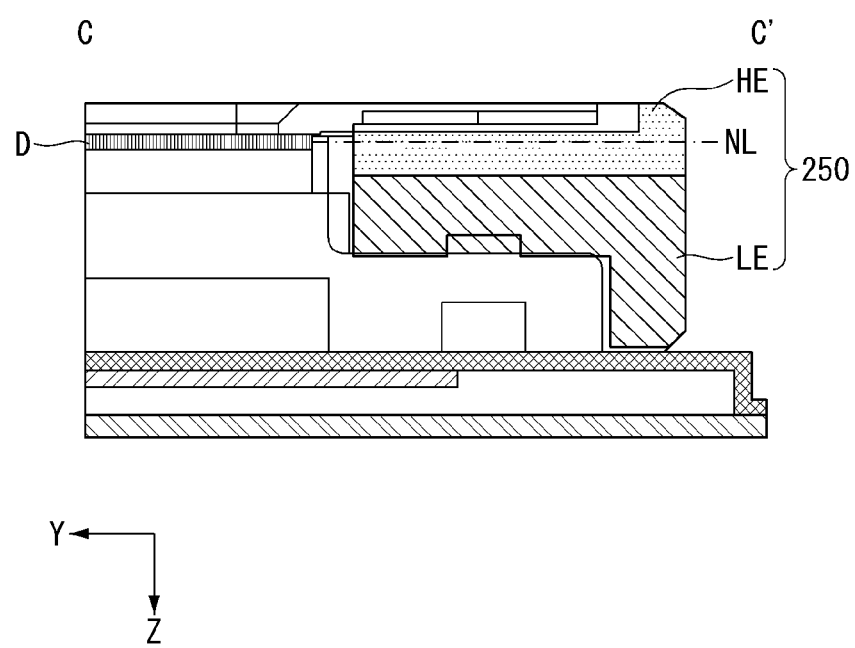
FIG. 25 is a view showing a cut along the line X-X' in FIG. 24.

FIG. 24 is a view for explaining a mobile terminal according to an embodiment of the present invention. FIG. 25 is a view showing a cut along line C-C' in FIG. 24.

Referring to FIGS. 24 and 25, the display D may be bent or folded in the second state. The neutral plane may be located on the display D. Compressive stress may occur on one side of the display D with respect to the neutral plane and tensile stress may occur on the other side of the display D.

The display D may be disposed at substantially the same position as the neutral plane of the hinge cover 250. If the neutral plane of the display D is disposed at the same position as the neutral plane of the hinge cover 250, the damage to the display D can be reduced.

If the neutral plane of the display D is different from the neutral plane of the hinge cover 250, the compressive stress and the tensile stress of the display D generated by bending are offset or increased from the compressive stress and the tensile stress of the hinge cover 250. Accordingly, the display D can be damaged.

Figure 26:
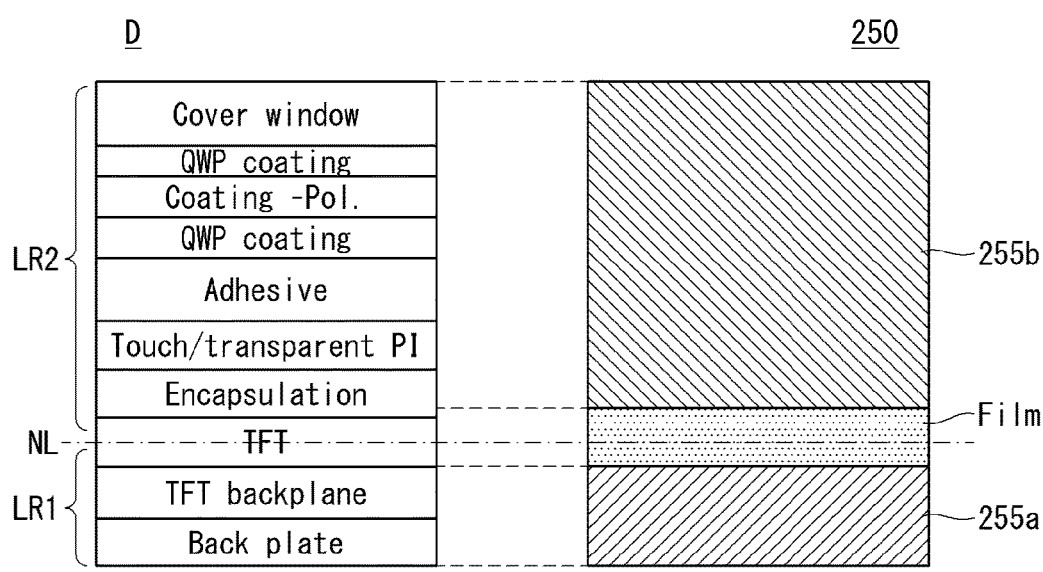
FIG. 26 is a view for explaining a neutral plane of a display and a neutral plane of a hinge cover according to an embodiment of the present invention.

Referring to FIG. 26, the display D according to the embodiment of the present invention may include at least one layer. The display D may include a first layer LR1 and a second layer LR2. Each of the plurality of layers of the display D may be constituted by lamination. The display D can have the TFT layer of the plurality of layers as the neutral plane. The TFT layer may be located between the first layer LR1 and the second layer LR2.

The upper end of the TFT layer can be designed to be subjected to compressive stress and the lower end of the TFT layer can be designed to be tensioned based on the TFT layer where the neutral plane is located. The top of the TFT layer may be the second layer LR2. The lower end of the TFT layer may be the first layer LR1.

The second layer LR2 may include a cover window, a plurality of optical coating layers (QWP coating, Coating—Pol), an adhesive layer, a touch film, an encapsulation layer, and the like. The first layer LR1 may include a TFT backplane, a backplane, and the like.

If the TFT layer is subjected to compressive stress or tensile stress in the second state, cracking or peeling of the wiring may occur. If the TFT layer is damaged, the display function of the display D can be reduced.

A film layer (Film) may be positioned between the first layer 255a and the second layer 255b of the hinge cover 250. The neutral plane of the hinge cover 250 may be located in the film layer (Film). The neutral plane NL of the hinge cover 250 may coincide with the neutral plane NL of the display D.

Figure 27:
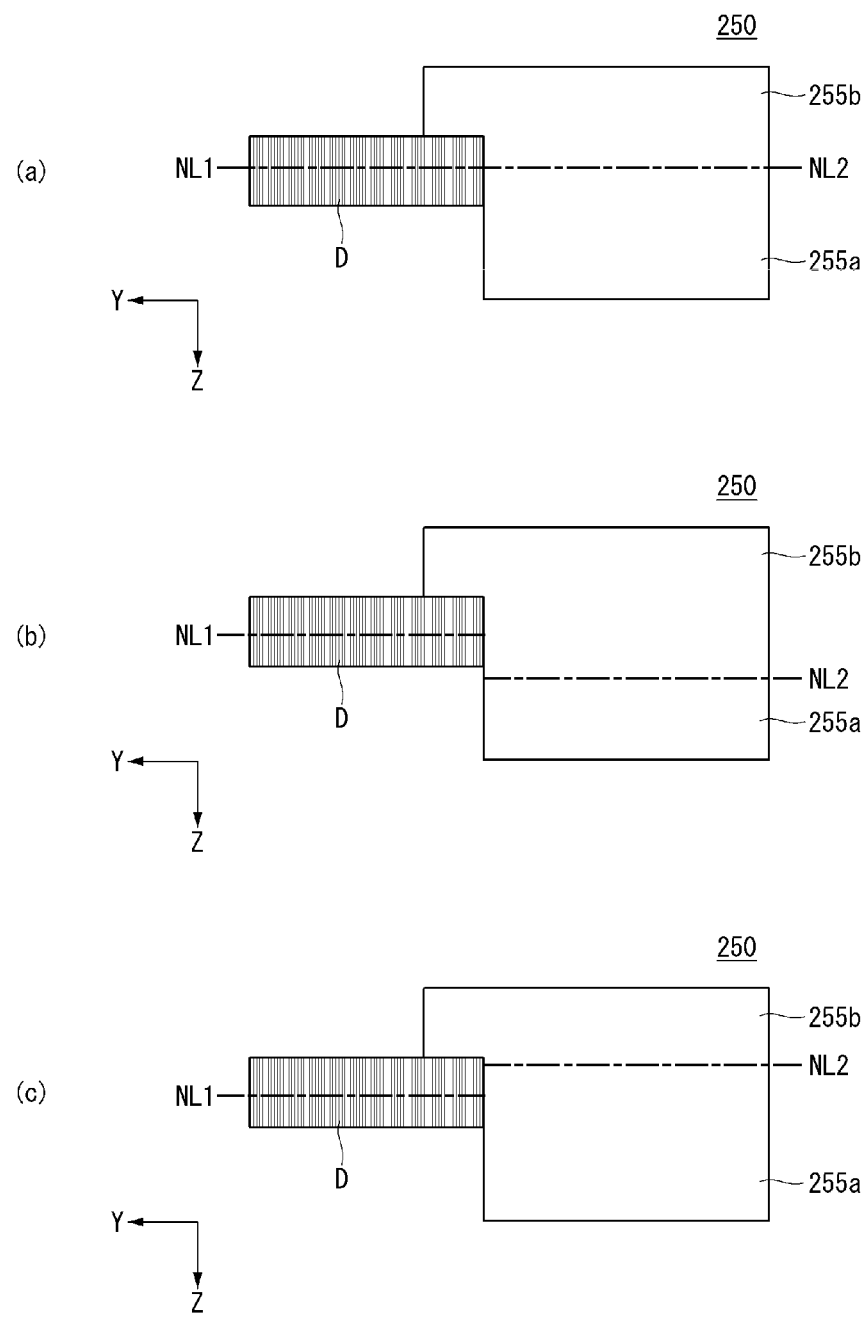
FIG. 27 is a view illustrating the neutral plane of the display and the neutral plane of the hinge cover according to the embodiment of the present invention.

Referring to FIG. 27 (a), in the first state, the neutral plane NL1 of the display D may coincide with the neutral plane NL2 of the hinge cover 250. When the neutral plane NL1 of the display D coincides with the neutral plane NL2 of the hinge cover 250, the stress of the display D due to bending can be reduced. If the neutral plane NL1 of the display D coincides with the neutral plane NL2 of the hinge cover 250, damage to the display D can be suppressed.

Referring to FIGS. 27 (b) and 27 (c), the neutral plane NL1 of the display D may not coincide with the neutral plane NL2 of the hinge cover 250 in the first state. When the neutral plane NL1 of the display D is higher than the neutral plane NL2 of the hinge cover 250, compressive stress is applied to the display D, and EL peeling may occur. When the neutral plane NL1 of the display D is lower than the neutral plane NL2 of the hinge cover 250, tensile stress is applied to the display D and cracks may be generated in the wiring of the TFT layer.

Figure 28:
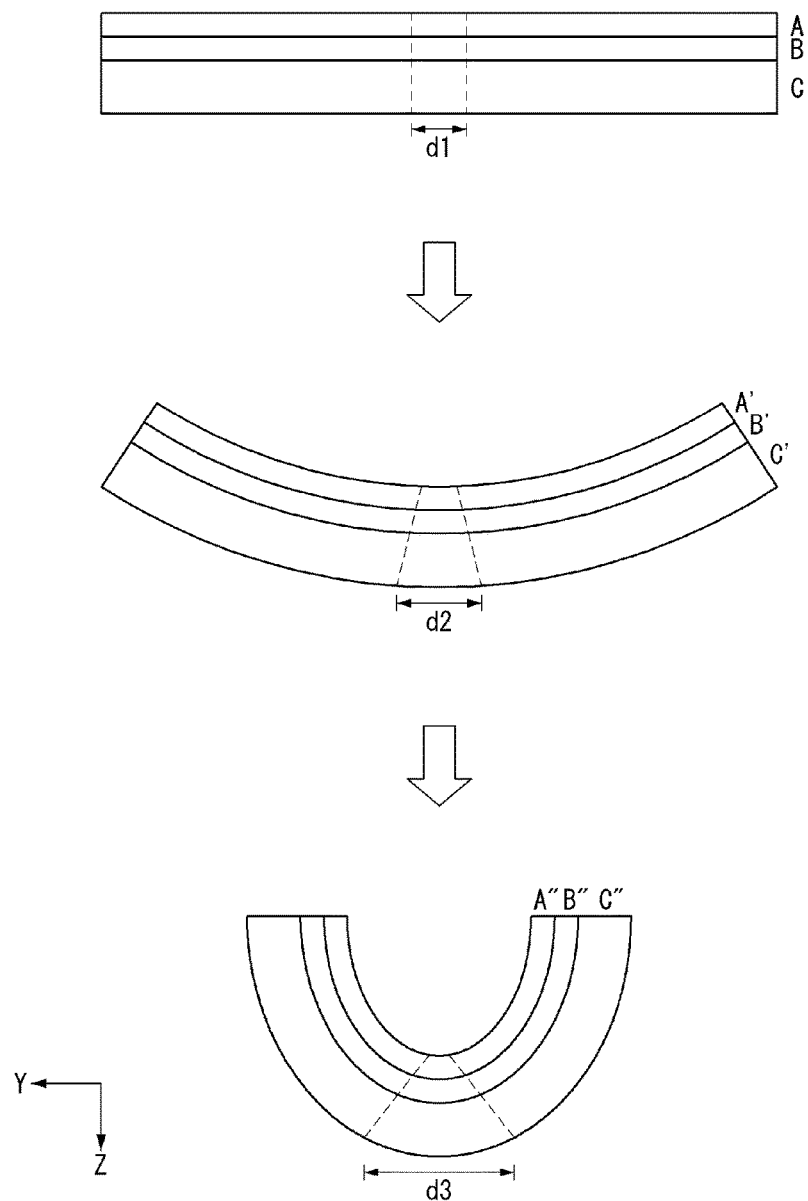
FIG. 28 is a view for explaining setting of the hardness of the hinge cover according to the embodiment of the present invention.

Referring to FIG. 28, the hinge cover 250 according to the embodiment of the present invention may include layers A to C, respectively. The distance d1 of one section of the layer C in the first state may be a distance d2 or d3 depending on the angle at which the hinge cover 250 is bent.

Layer A may be affected by compressive stress. The layer A can be reduced in length as the hinge cover 250 is bent. As the hinge cover 250 is bent, the length of the layer A is the longest and the length of the layer A" is the shortest. The length of the layer A' is shorter than the length of the layer A and greater than the length of the layer A".

Layer C may be affected by tensile stress. The layer C may be increased in length as the hinge cover 250 is bent. That is, the length of the layer C is the shortest, and the length of the layer C" is the longest. The length of the layer C' is longer than the length of the layer C, and may be shorter than the length of the layer C".

The layer B may be located on the neutral plane. A change in the length of the layer B may hardly occur.

Layer C may contain a relatively low modulus material. Low modulus materials can be advantageous for tensile. Layer A may contain a relatively high modulus material. Since the length of the layer B hardly changes, it can include a rigid material.

For example, layer A may comprise high hardness silicon or urethane. For example, layer C may comprise low-hardness silicon or urethane. Layer B may include a neutral plane.

The scope of the present invention should be determined by rational interpretation of the appended claims, and all changes within the equivalence range of the present invention are included in the scope of the present invention.

Certain embodiments of the invention described above or other embodiments are not mutually exclusive or distinct from each other. Any or all of the embodiments of the invention described above may be combined or combined with each other.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal comprising:
a flexible display;
a first body positioned at a rear of the flexible display, the first body connected to the flexible display;
a second body positioned at the rear of the flexible display, the second body connected to the flexible display and spaced apart from the first body, the second body foldable with respect to the first body;
a hinge assembly positioned at the rear of the flexible display, the hinge assembly located between the first body and the second body, the hinge assembly elongated along between the first body and the second body, the hinge assembly connecting the first body and the second body; and
a hinge cover positioned at an end of the hinge assembly, the hinge cover between the first body and the second body, the hinge cover coupled to the first and second bodies, the hinge cover covering the end of the hinge assembly, the hinge cover having a thickness in a direction from the flexible display to the hinge cover, wherein the thickness of the hinge cover is smaller as it goes from the bodies toward a central portion of the hinge cover.

2. The mobile terminal of claim 1, wherein the hinge cover includes:
a first surface forming a rear surface of the hinge cover; and
a second surface opposite the first surface, the second surface forming a front surface of the hinge cover.

3. The mobile terminal of claim 2, wherein the first surface is convex in a direction from the first surface toward the second surface.

4. The mobile terminal of claim 3, wherein the first surface includes a groove.

5. The mobile terminal of claim 3, wherein a length of the first surface is greater than a length of the second surface in a direction between both ends of the hinge cover.

6. A mobile terminal comprising:
a flexible display;
a first body positioned at a rear of the flexible display, the first body connected to the flexible display;
a second body positioned at the rear of the flexible display, the second body connected to the flexible display and spaced apart from the first body, the second body foldable with respect to the first body;
a hinge assembly positioned at the rear of the flexible display, the hinge assembly located between the first body and the second body, the hinge assembly connecting the first body and the second body, the hinge assembly elongated along between the first body and the second body; and
a hinge cover positioned at an end of the hinge assembly, the hinge cover between the first body and the second body, the hinge cover coupled to the first and second bodies, the hinge cover covering the end of the hinge assembly,
wherein the hinge cover includes a plurality of layers, and
wherein a layer among the plurality of layers has a modulus different from a modulus of an another layer among the plurality of layers.

7. The mobile terminal of claim 6, wherein the hinge cover includes:
a first layer forming a rear surface of the hinge cover; and
a second layer positioned at a front of the first layer,
wherein the second layer has a modulus greater than a modulus of the first layer.

8. The mobile terminal of claim 7, wherein the hinge cover forms a neutral plane, wherein a side of the hinge cover is provided with a compressive stress, wherein an another side of the hinge cover is provided with a tensile stress, wherein the neutral plane is between the side of the hinge cover and the another side of the hinge cover.

9. The mobile terminal of claim 8, wherein the neutral plane coincides with a boundary between the first layer and the second layer.

10. The mobile terminal of claim 8, wherein the neutral plane of the hinge cover is located at the flexible display.

11. The mobile terminal of claim 8, wherein the hinge cover includes a third layer positioned between the first layer and the second layer, wherein the neutral plane is located in the third layer.

12. The mobile terminal of claim 11, wherein the third layer has a hardness greater than a hardness of the first layer and the second layer.

* * * * *